(12) United States Patent
Kim et al.

(10) Patent No.: US 10,580,939 B2
(45) Date of Patent: Mar. 3, 2020

(54) SEMICONDUCTOR LIGHT-EMITTING DEVICE INCLUDING A REFLECTOR LAYER HAVING A MULTI-LAYERED STRUCTURE

(71) Applicant: SAMSUNG ELECTRONICS CO., LTD., Suwon-si, Gyeonggi-do (KR)

(72) Inventors: JungSung Kim, Seoul (KR); Junghee Kwak, Daegu (KR); Seong Seok Yang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/718,438

(22) Filed: Sep. 28, 2017

(65) Prior Publication Data
US 2018/0138372 A1    May 17, 2018

(30) Foreign Application Priority Data
Nov. 16, 2016 (KR) .................. 10-2016-0152800

(51) Int. Cl.
*H01L 33/46* (2010.01)
*H01L 33/32* (2010.01)
(Continued)

(52) U.S. Cl.
CPC ............. *H01L 33/46* (2013.01); *H01L 33/32* (2013.01); *H01L 33/387* (2013.01); *H01L 33/42* (2013.01);
(Continued)

(58) Field of Classification Search
CPC ......... H01L 33/38; H01L 33/40; H01L 33/42; H01L 33/46; H01L 33/36; H01L 33/44;
(Continued)

(56) References Cited

U.S. PATENT DOCUMENTS 7,294,864 B2    11/2007    Kim et al.
7,465,592 B2    12/2008    Yoo
(Continued)

FOREIGN PATENT DOCUMENTS

KR    10-2012-0084119 A    7/2012

*Primary Examiner* — Matthew C Landau
*Assistant Examiner* — Priya M Rampersaud
(74) *Attorney, Agent, or Firm* — Lee IP Law, P.C.

(57) ABSTRACT

A semiconductor light-emitting device includes a light-emitting structure including a first semiconductor layer, an active layer, and a second semiconductor layer which are sequentially stacked, a first insulating layer on the second semiconductor layer with a plurality of first openings having first widths and a plurality of second openings having second widths different from the first widths, a first electrode electrically connected to the first semiconductor layer through the first openings, a first sub-electrode layer between the second semiconductor layer and the first insulating layer, the first sub-electrode layer being exposed through the second openings, and a second sub-electrode layer on the first insulating layer, the second sub-electrode layer being connected to the first sub-electrode layer through the second openings, wherein a first distance between the first openings closest to each other is different from a second distance between the second openings closest to each other.

18 Claims, 26 Drawing Sheets

(51) Int. Cl.
*H01L 33/42* (2010.01)
*H01L 33/54* (2010.01)
*H01L 33/62* (2010.01)
*H01L 33/06* (2010.01)
*H01L 33/10* (2010.01)
*H01L 33/38* (2010.01)
*H01L 33/40* (2010.01)

(52) U.S. Cl.
CPC ............. *H01L 33/54* (2013.01); *H01L 33/62* (2013.01); *H01L 33/06* (2013.01); *H01L 33/10* (2013.01); *H01L 33/405* (2013.01); *H01L 2224/16245* (2013.01); *H01L 2224/48091* (2013.01); *H01L 2933/0016* (2013.01)

(58) Field of Classification Search
CPC ............. H01L 2924/00; H01L 33/382; H01L 2224/48091; H01L 2924/00014; H01L 2224/16245; H01L 2933/0016; H01L 33/06; H01L 33/10; H01L 33/32; H01L 33/387; H01L 33/405; H01L 33/54; H01L 33/62; H01L 33/50; H01L 33/52
See application file for complete search history.

(56) References Cited

U.S. PATENT DOCUMENTS

| | | | |
|---|---|---|---|
| 7,872,276 B2 | 1/2011 | Lee et al. | |
| 8,901,815 B2 | 12/2014 | Lee et al. | |
| 9,281,446 B2 | 3/2016 | Suh et al. | |
| 9,293,675 B2 | 3/2016 | Yang et al. | |
| 2008/0185606 A1* | 8/2008 | Sano | H01L 33/38 257/98 |
| 2013/0049053 A1* | 2/2013 | Kususe | H01L 33/38 257/98 |
| 2014/0225143 A1* | 8/2014 | Kususe | H01L 33/62 257/98 |
| 2016/0181477 A1* | 6/2016 | Lee | H01L 33/40 257/98 |
| 2018/0130924 A1* | 5/2018 | Ko | H01L 33/0079 |

* cited by examiner

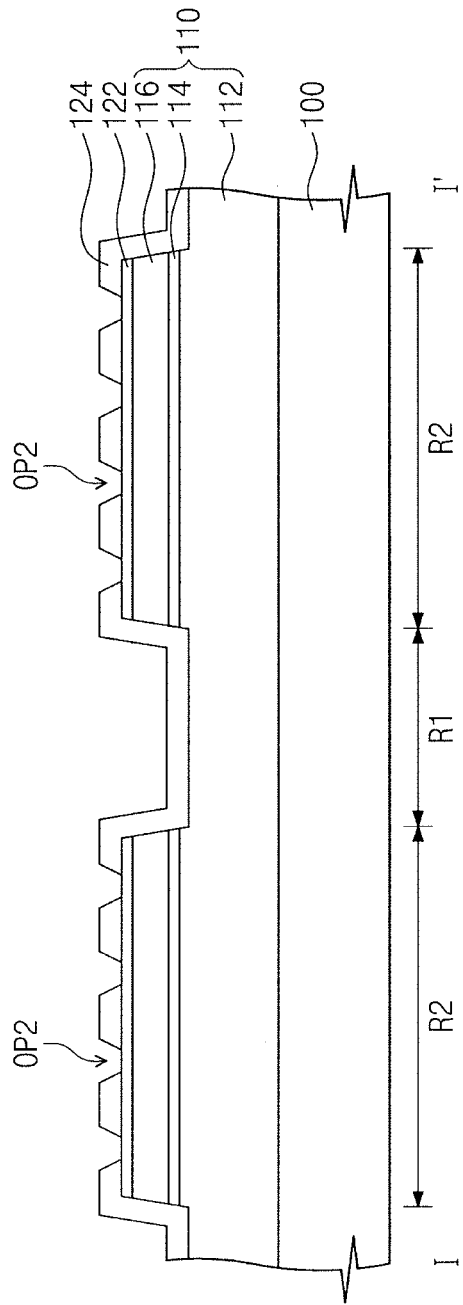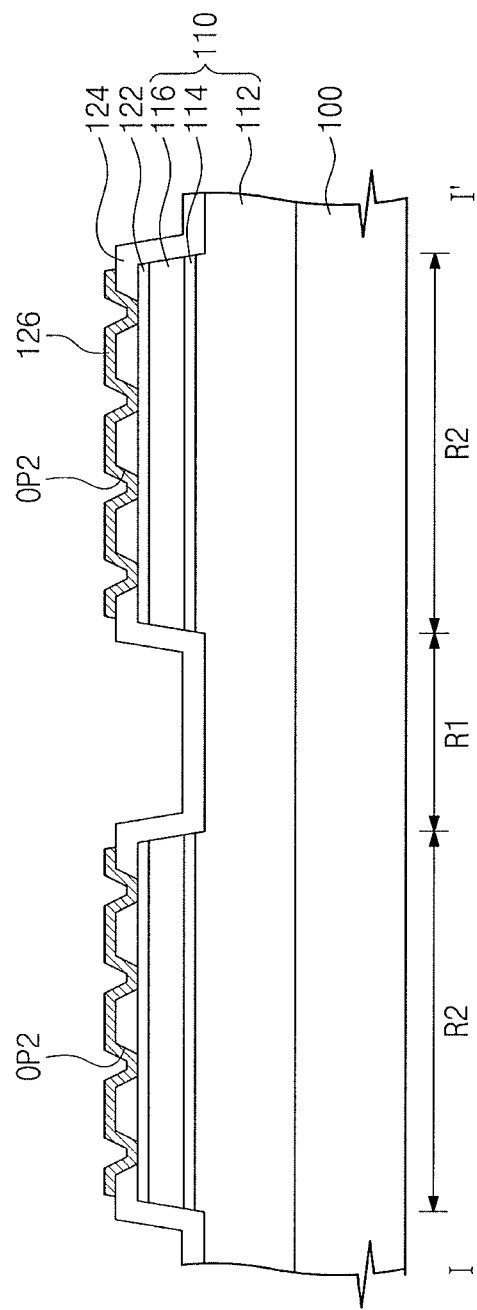

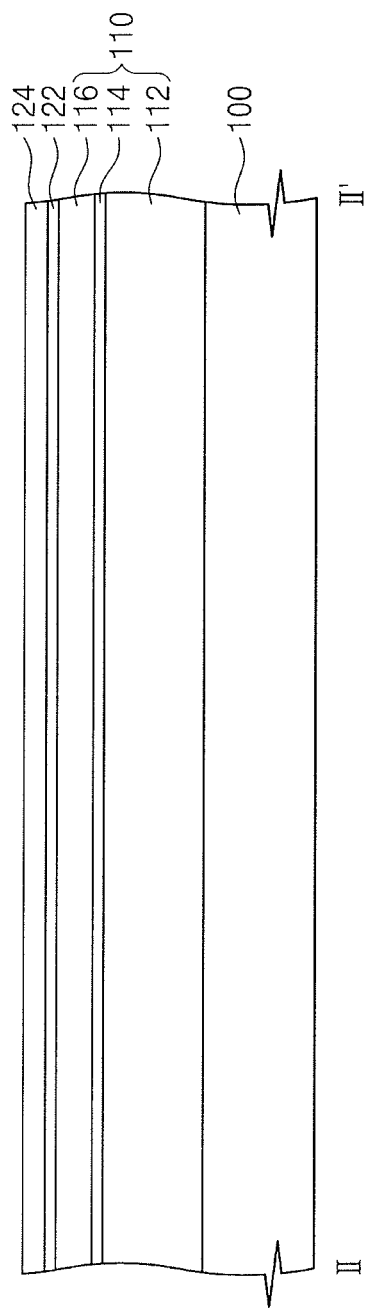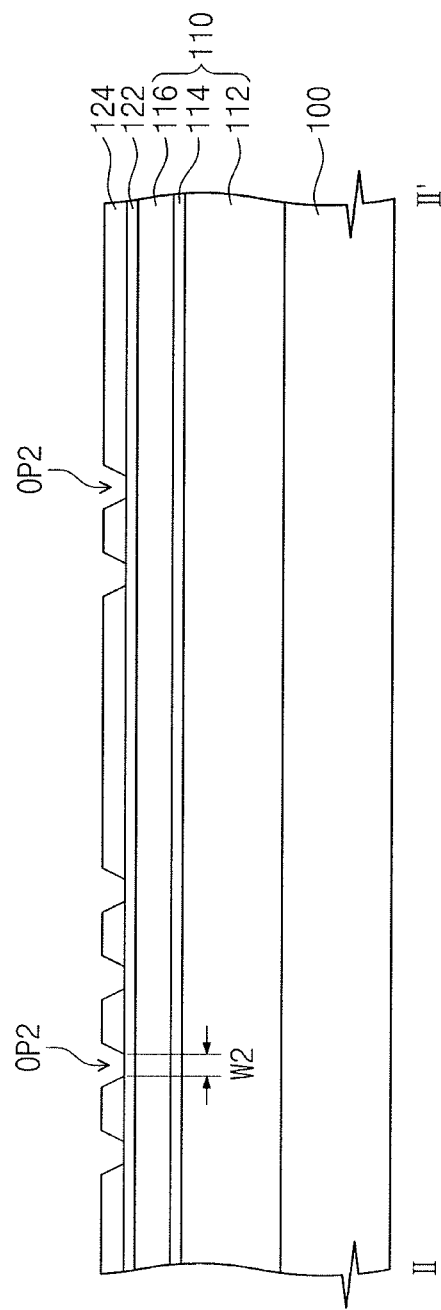

SEMICONDUCTOR LIGHT-EMITTING DEVICE INCLUDING A REFLECTOR LAYER HAVING A MULTI-LAYERED STRUCTURE

CROSS-REFERENCE TO RELATED APPLICATION

Korean Patent Application No. 10-2016-0152800, filed on Nov. 16, 2016, in the Korean Intellectual Property Office, and entitled: "Semiconductor Light-Emitting Device Including a Reflector Layer Having a Multi-Layered Structure," is incorporated by reference herein in its entirety.

BACKGROUND

1. Field

Embodiments relate to a semiconductor light-emitting device and, more particularly, to a semiconductor light-emitting device including a reflector layer having a multi-layered structure.

2. Description of the Related Art

A semiconductor light-emitting device, e.g., a light-emitting diode, may be a device of which a material emits light. In the semiconductor light-emitting device, electrons and holes of a junction-type semiconductor are recombined with each other to generate energy, and the generated energy may be converted into light. The converted light may be emitted from the semiconductor light-emitting device. The semiconductor light-emitting devices are widely used in, e.g., lighting apparatuses, display devices, and light sources, and the development thereof is accelerating.

In particular, gallium nitride (GaN)-based light-emitting diodes have been commercialized, e.g., in keypads for portable phones, turn signal lamps, and flashes of cameras. In addition, general light apparatuses have been developed using light-emitting diodes. Furthermore, the light-emitting diodes have been used in large-sized application products, e.g., backlight units of large-sized televisions and vehicle headlights.

SUMMARY

In an aspect, a semiconductor light-emitting device may include a light-emitting structure including a first semiconductor layer, an active layer and a second semiconductor layer which are sequentially stacked, a first insulating layer disposed on the second semiconductor layer, the first insulating layer including a plurality of first openings, each of which has a first width, and a plurality of second openings, each of which has a second width different from the first width, a first electrode electrically connected to the first semiconductor layer through the first openings, a first sub-electrode layer disposed between the second semiconductor layer and the first insulating layer and exposed through the second openings, and a second sub-electrode layer disposed on the first insulating layer and connected to the first sub-electrode layer through the second openings. A first distance between the first openings closest to each other may be different from a second distance between the second openings closest to each other.

In an aspect, a semiconductor light-emitting device may include a growth substrate, a light-emitting structure including a first semiconductor layer, an active layer and a second semiconductor layer which are sequentially stacked on the growth substrate, the light-emitting structure including first regions exposing the first semiconductor layer and a second region thicker than the first regions, a transparent electrode layer disposed on the second region and being in contact with the second semiconductor layer, a first insulating layer disposed on the first and second regions and having first openings exposing the first semiconductor layer and second openings exposing the transparent electrode layer, a reflective metal layer being in contact with the first semiconductor layer exposed through the first openings, and a sub-electrode layer disposed on the first insulating layer on the second region. The sub-electrode layer may be in contact with the transparent electrode layer exposed through the second openings. A first width of each of the first openings may be greater than a second width of each of the second openings, and a first distance between the first openings closest to each other may be greater than a second distance between the second openings closest to each other.

In an aspect, a semiconductor light-emitting device may include a light-emitting structure including a first semiconductor layer, an active layer and a second semiconductor layer which are sequentially stacked, a first electrode on the second semiconductor layer, a second electrode between the second semiconductor layer and the first electrode, and connection contacts disposed in first openings which penetrate the second electrode, the second semiconductor layer, and the active layer to expose the first semiconductor layer. The second electrode may include a transparent electrode layer being in contact with the second semiconductor layer, a first insulating layer disposed on the transparent electrode layer and including a plurality of second openings exposing the transparent electrode layer, and a reflective metal layer disposed on the first insulating layer and extending into the second openings so as to be in contact with the transparent electrode layer. The first openings may be two-dimensionally arranged and the second openings may be two-dimensionally arranged. A first width of each of the first openings may be greater than a second width of each of the second openings, and a first distance between the first openings closest to each other may be greater than a second distance between the second openings closest to each other.

In an aspect, a semiconductor light-emitting device may include a light-emitting structure including a first semiconductor layer, an active layer, and a second semiconductor layer which are sequentially stacked, a first insulating layer on the second semiconductor layer, the first insulating layer including a plurality of first openings having first widths, and a plurality of second openings having second widths different from the first width a first electrode electrically connected to the first semiconductor layer through the first openings, a first sub-electrode layer between the second semiconductor layer and the first insulating layer, the first sub-electrode layer being exposed through the second openings, and a second sub-electrode layer on the first insulating layer, the second sub-electrode layer being connected to the first sub-electrode layer through the second openings, wherein a first distance between first openings directly adjacent to each other is different from a second distance between second openings directly adjacent to each other.

BRIEF DESCRIPTION OF THE DRAWINGS

Features will become apparent to those of ordinary skill in the art by describing in detail exemplary embodiments with reference to the attached drawings, in which:

FIGS. 7 to 12 illustrate cross-sectional views along line I-I' of FIG. 2B of stages in a method for manufacturing a semiconductor light-emitting device, according to some embodiments.

FIGS. 16 to 21 illustrate cross-sectional views along line II-II' of FIG. 14 of stages in a method for manufacturing a semiconductor light-emitting device, according to some embodiments.

DETAILED DESCRIPTION

Embodiments will be described hereinafter in detail with reference to the accompanying drawings.

Figure 1A:
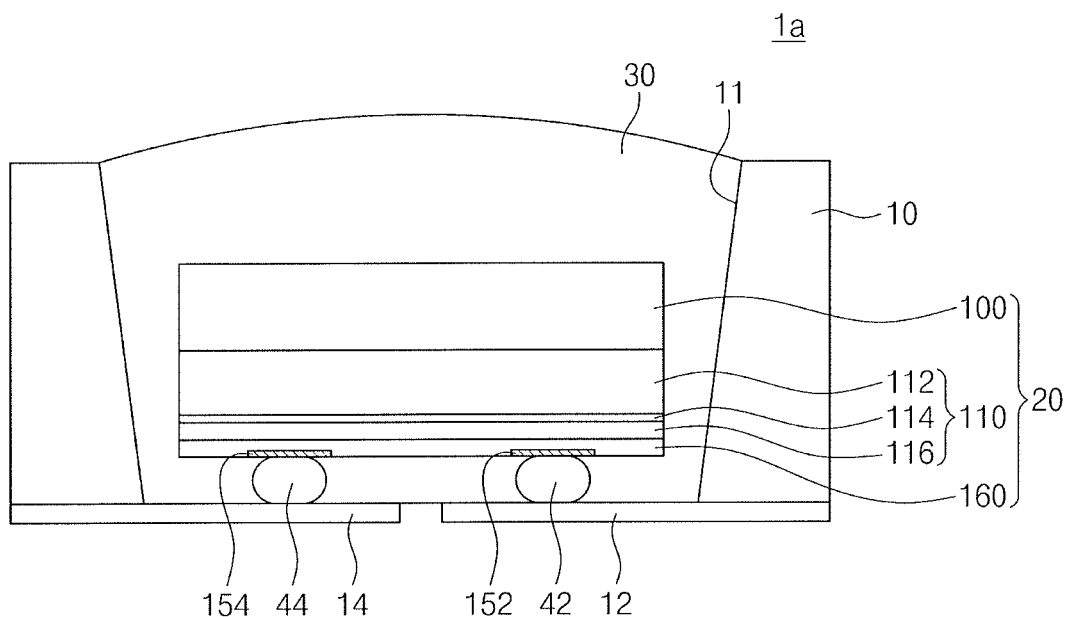
FIGS. 1A and 1B illustrate schematic cross-sectional views of semiconductor light-emitting device packages according to some embodiments.
Figure 1B:
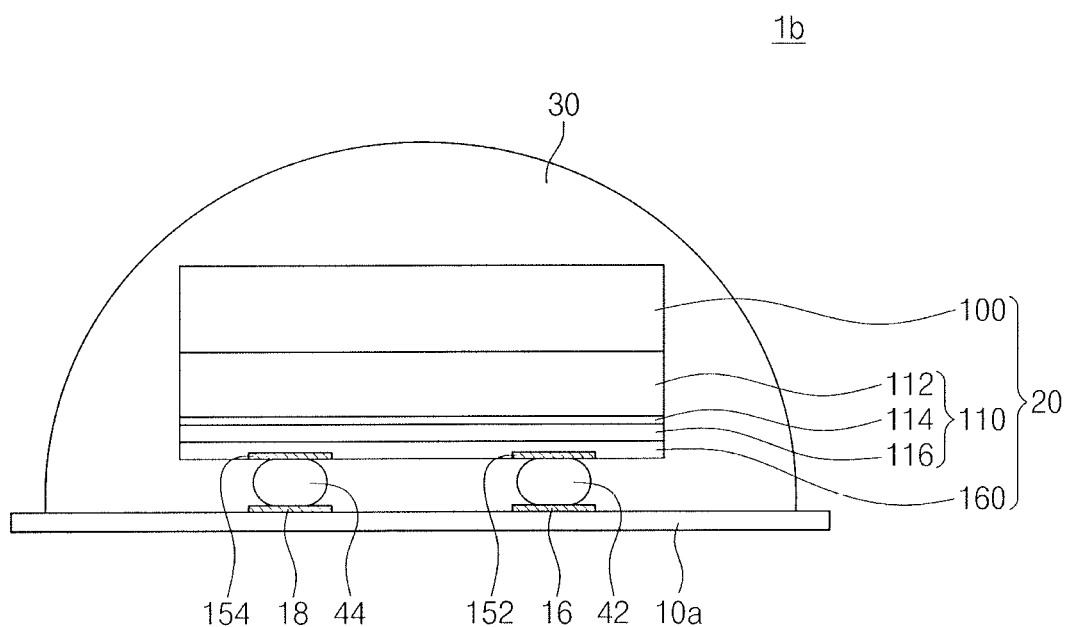

FIGS. 1A and 1B are schematic cross-sectional views illustrating semiconductor light-emitting device packages according to some embodiments.

Referring to FIG. 1A, a semiconductor light-emitting device package 1a according to some embodiments may include a package body 10, a pair of lead frames 12 and 14, a semiconductor light-emitting device 20, and a sealing layer 30. The pair of lead frames 12 and 14 may include a first lead frame 12 and a second lead frame 14.

The semiconductor light-emitting device 20 may include a light-emitting structure 110 and an electrode structure 160 which are sequentially stacked on a growth substrate 100. The light-emitting structure 110 may include first and second semiconductor layers 112 and 116 having different conductivity types, and an active layer 114 disposed between the first and second semiconductor layers 112 and 116, e.g., the first semiconductor layer 112 may be between the active layer 114 and the growth substrate 100. The electrode structure 160 may include electrodes respectively connected to the first and second semiconductor layers 112 and 116, and under-bump metallurgy (UBM) patterns 152 and 154 electrically connected to the electrodes.

The semiconductor light-emitting device 20 may be mounted on the first and second lead frames 12 and 14 through respective connecting terminals 42 and 44, which are bonded to the UBM patterns 152 and 154, respectively. For example, a first UBM pattern 152 may be electrically connected to the first lead frame 12 through a first connecting terminal 42, and a second UBM pattern 154 may be electrically connected to the second lead frame 14 through a second connecting terminal 44. The connecting terminals 42 and 44 may include, e.g., bumps or solder balls. Each of the first and second UBM patterns 152 and 154 may be provided in singular or plural.

The package body 10 may include a reflective cup 11 for improving reflection efficiency and extraction efficiency of light. The sealing layer 30 formed of a transparent material may be disposed in the reflective cup 11 to seal the semiconductor light-emitting device 20. The sealing layer 30 may include a resin in which a fluorescent substance is dispersed. The fluorescent substance may include, e.g., a green fluorescent substance and/or a red fluorescent substance.

Electron-hole recombination may occur in the active layer 114 by an electrical signal provided through the electrode structure 160. Light generated by the electron-hole recombination may be emitted upward through the growth substrate 100. In other words, the semiconductor light-emitting device 20 may have a flip-chip structure emitting light through the growth substrate 100.

Referring to FIG. 1B, a semiconductor light-emitting device package 1b may include a mounting substrate 10a, the semiconductor light-emitting device 20, and the sealing layer 30. The semiconductor light-emitting device 20 may be the same as described with reference to FIG. 1A, and thus the descriptions thereof will be omitted.

The semiconductor light-emitting device 20 may be mounted on the mounting substrate 10a so as to be electrically connected to first and second circuit patterns 16 and 18. For example, the first UBM pattern 152 may be electrically connected to the first circuit pattern 16 through the first connecting terminal 42, and the second UBM pattern 154 may be electrically connected to the second circuit pattern 18 through the second connecting terminal 44. For example, the mounting substrate 10a may be a printed circuit board (PCB), a metal core PCB (MCPCB), a multi-layered PCB (MPCB), or a flexible PCB (FPCB). In certain embodiments, the structure of the mounting substrate 10a may be variously applied. The semiconductor light-emitting device 20 may be sealed by the sealing layer 30. Thus, a chip-on-board (COB)-type package structure may be realized.

In the present specification, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The semiconductor light-emitting device 20 according to some embodiments will be described hereinafter in more detail.

Figure 2A:
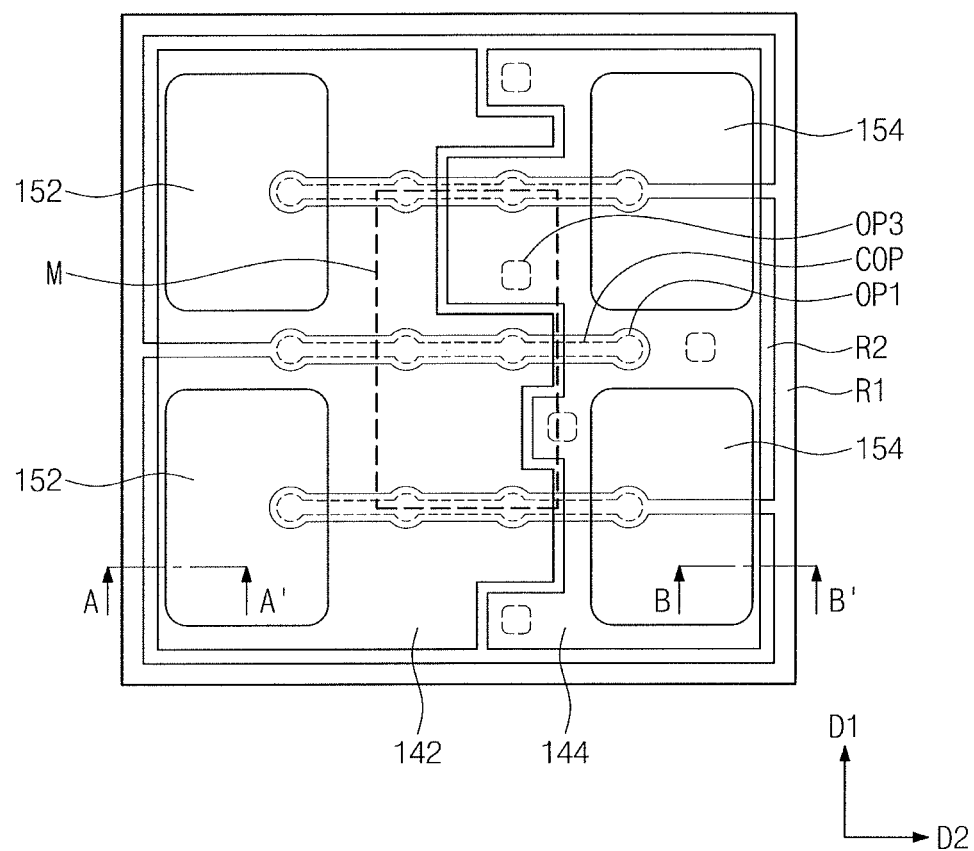
FIG. 2A illustrates a schematic plan view of a semiconductor light-emitting device according to some embodiments.
Figure 2B:
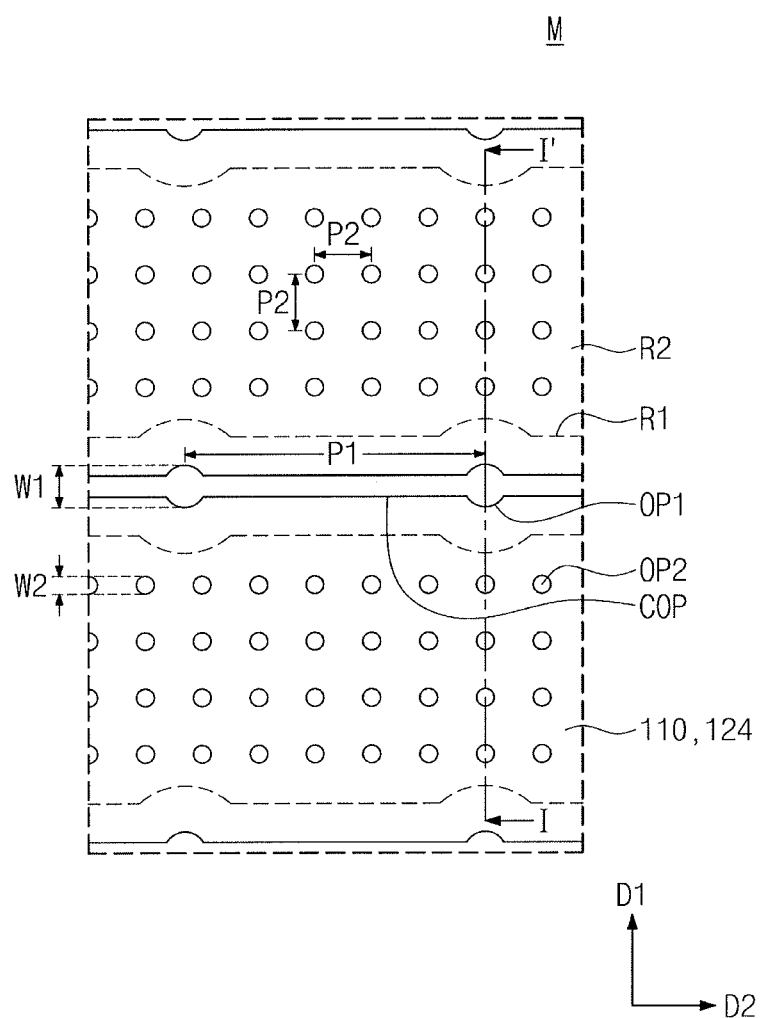
FIG. 2B illustrates an enlarged view of portion 'M' of FIG. 2A.
Figure 3A:
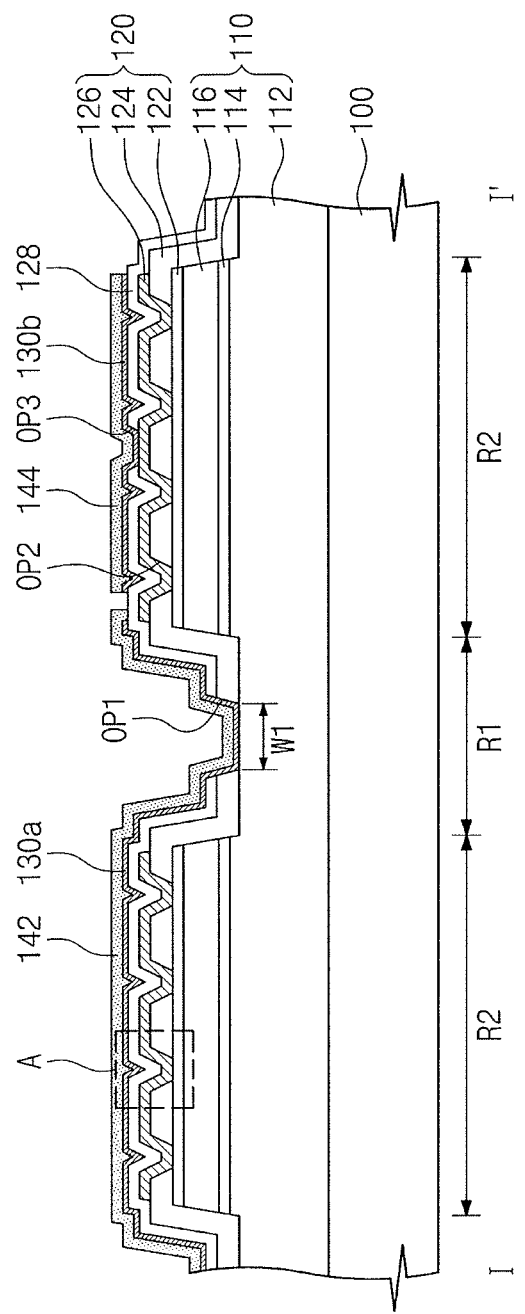
FIG. 3A illustrates a cross-sectional view along line I-I' of FIG. 2B.
Figure 3B:
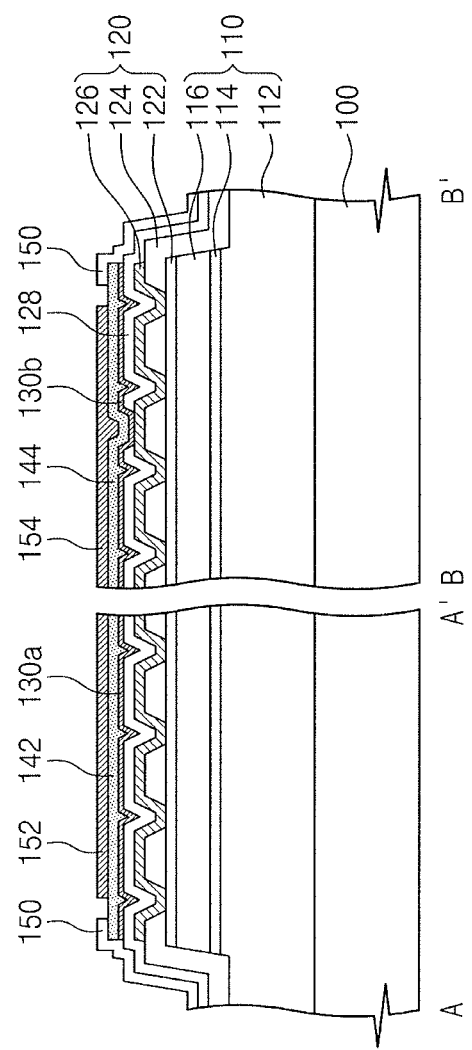
FIG. 3B illustrates a cross-sectional view along lines A-A' and B-B' of FIG. 2A.
Figure 4A:
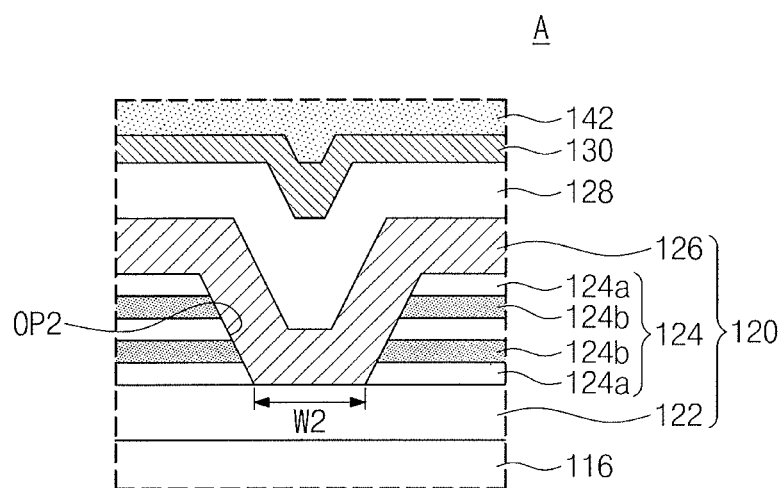
FIGS. 4A to 4C illustrate enlarged views corresponding to portion 'A' of FIG. 3A.
Figure 4B:
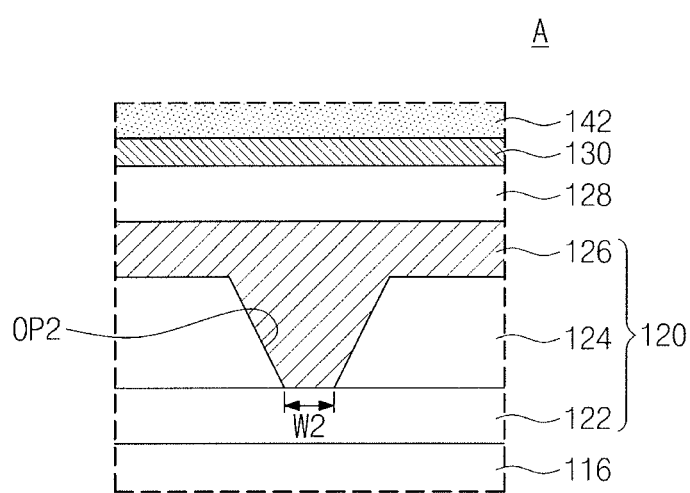
Figure 4C:
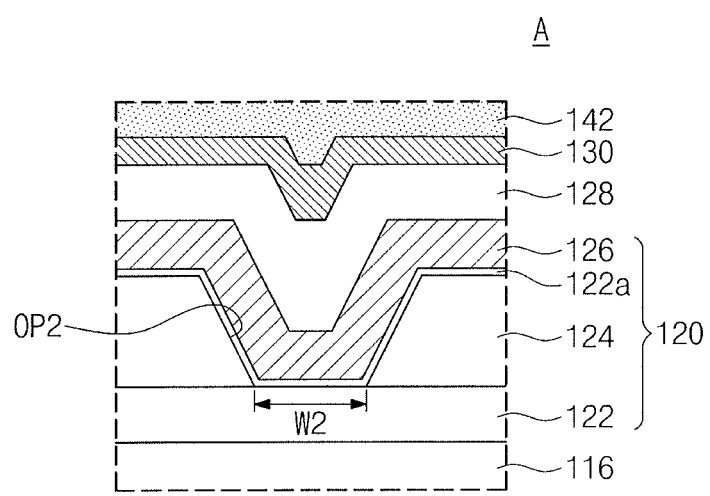
Figure 5A:
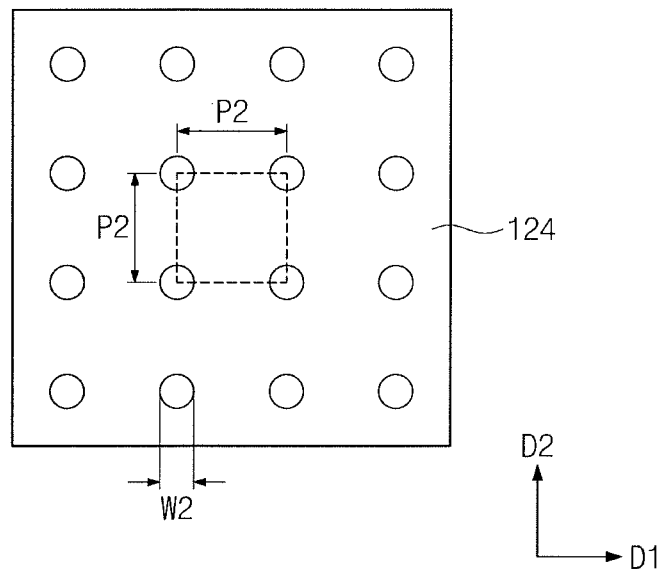
FIGS. 5A to 5C illustrate plan views of a portion of a first insulating layer of FIG. 3A.
Figure 5B:
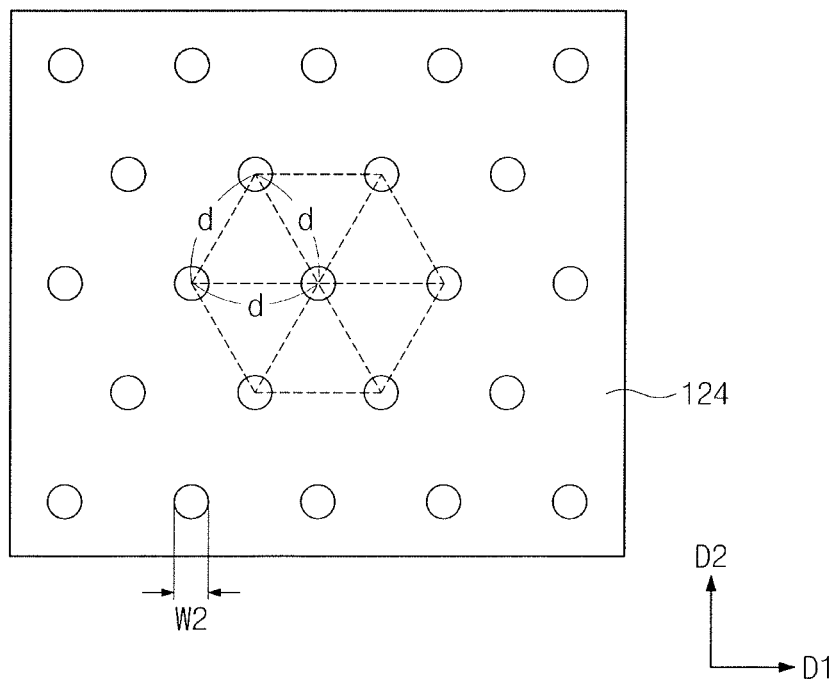
Figure 5C:
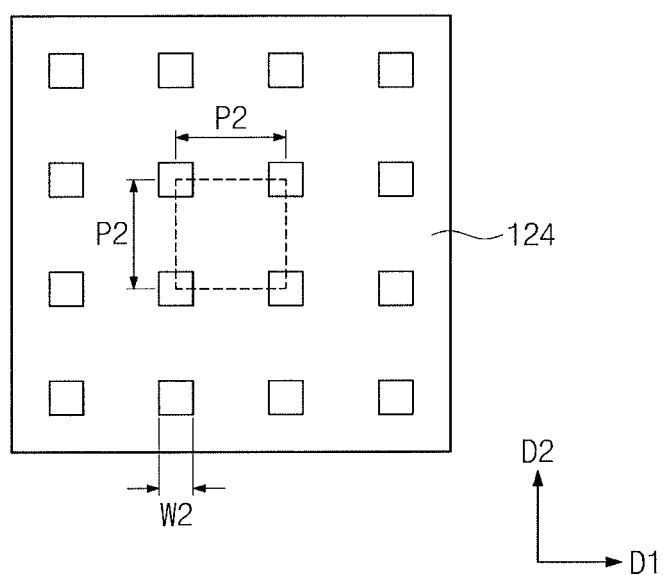
Figure 6:
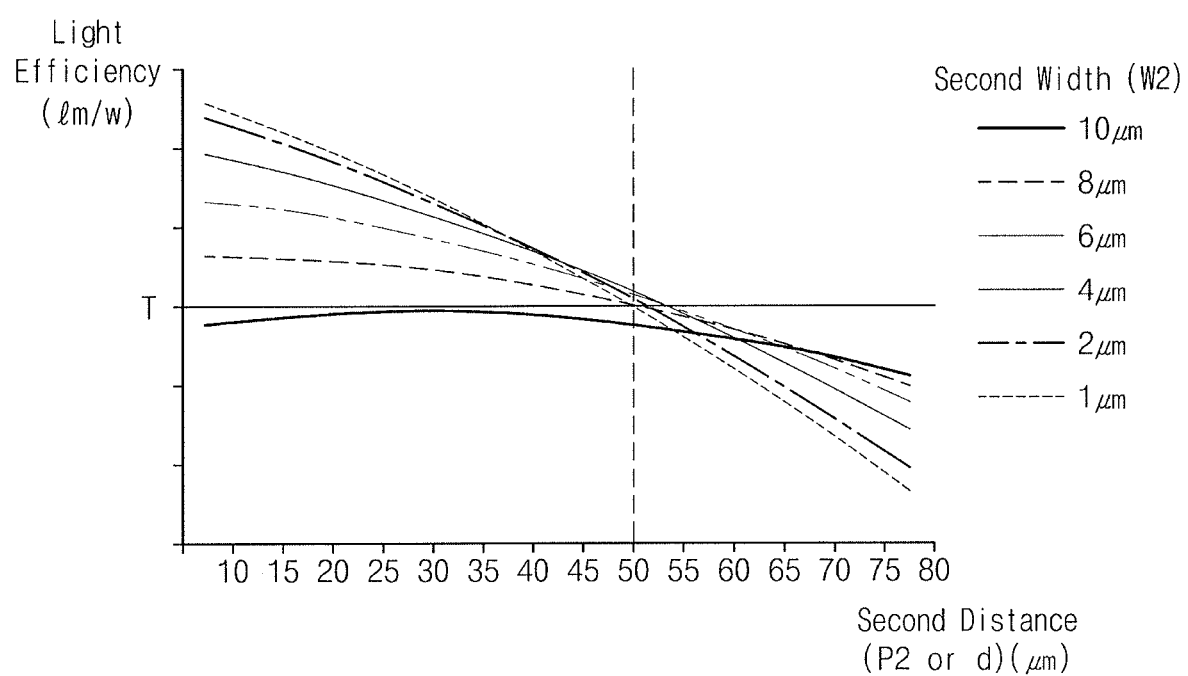
FIG. 6 illustrates a graph of light efficiency of a semiconductor light-emitting device according to a width and a pitch of second openings of a first insulating layer.

FIG. 2A is a schematic plan view illustrating the semiconductor light-emitting device 20, and FIG. 2B is an enlarged view of portion 'M' of FIG. 2A. FIG. 3A is a cross-sectional view taken along line I-I' of FIG. 2B, and FIG. 3B is a cross-sectional view taken along lines A-A' and B-B' of FIG. 2A. FIGS. 4A to 4C are enlarged views corresponding to portion 'A' of FIG. 3A. FIGS. 5A to 5C are plan views illustrating a portion of a first insulating layer of FIG. 3A. FIG. 6 is a graph illustrating light efficiency of a semiconductor light-emitting device according to a width and a pitch of second openings of a first insulating layer.

Referring to FIGS. 2A, 2B, 3A, 3B, and 4A, the semiconductor light-emitting device 20 may include the growth substrate 100 and the light-emitting structure 110 including the first semiconductor layer 112, the active layer 114, and the second semiconductor layer 116 sequentially stacked on the growth substrate 100. A buffer layer may be disposed between the growth substrate 100 and the first semiconductor layer 112 to relax stress generated by lattice mismatch between the growth substrate 100 and the first semiconductor layer 112. The growth substrate 100 may be a transparent substrate, e.g., a sapphire substrate.

The first semiconductor layer 112 may be formed of a semiconductor material doped with N-type dopants and may be, e.g., an N-type nitride semiconductor layer. The second semiconductor layer 116 may be formed of a semiconductor material doped with P-type dopants and may be, e.g., a P-type nitride semiconductor layer. The first and second semiconductor layers 112 and 116 may have a composition formula of $Al_xIn_yGa_{(1-x-y)}N$ (where $0 \leq x \leq 1$, $0 \leq y \leq 1$, and $0 \leq x+y \leq 1$) and may include, e.g., GaN, AlGaN, InGaN, or AlInGaN.

The active layer 114 disposed between the first and second semiconductor layers 112 and 116 may emit light having a predetermined energy by recombination of electrons and holes. The active layer 114 may include a material of which an energy band gap is smaller than those of the first and second semiconductor layers 112 and 116. For example, when the first and second semiconductor layers 112 and 116 are formed of a GaN-based compound semiconductor, the active layer 114 may include an InGaN-based compound semiconductor of which an energy band gap is smaller than that of the GaN-based compound semiconductor. The active layer 114 may have a multiple quantum well (MQW) structure in which quantum well layers and quantum barrier layers are alternately stacked, e.g., an InGaN/GaN structure. However, embodiments are not limited thereto. In certain embodiments, the active layer 114 may have a single quantum well (SQW) structure.

The light-emitting structure 110 may include a first region R1 and a second region R2. The first region R1 may correspond to an etched region of the light-emitting structure 110, in which the second semiconductor layer 116 and the active layer 114 are etched to expose a top surface of the first semiconductor layer 112. The second region R2 may correspond to a mesa region of the light-emitting structure 110, which is not etched during the formation of the first region R1. A sidewall of the second region R2 may be inclined downward toward the growth substrate 100.

A first sub-electrode layer 122 may be disposed on the second region R2 of the light-emitting structure 110. The first sub-electrode layer 122 may be in, e.g., direct, contact with a top surface of the second semiconductor layer 116. In some embodiments, a sidewall of the first sub-electrode layer 122 may have a profile which is continuous with the sidewall of the second region R2, e.g., lateral sidewalls of the first sub-electrode layer 122 and the second semiconductor layer 116 may be coplanar. The first sub-electrode layer 122 may be a transparent electrode layer. For example, the first sub-electrode layer 122 may include a transparent conductive oxide, e.g., indium-tin oxide (ITO), indium-zinc oxide (IZO), or indium-tin-zinc oxide (ITZO).

A first insulating layer 124 may be disposed on the first and second regions R1 and R2 of the light-emitting structure 110. The first insulating layer 124 may cover a top surface and the sidewalls of the first sub-electrode layer 122, the sidewalls of the second region R2, e.g., sidewalls of the second semiconductor layer 116 and of the active layer 114, and a top surface of the first region R, e.g., the top surface of the first semiconductor layer 112. The first insulating layer 124 may be formed of an insulating material of which a refractive index is lower than that of the second semiconductor layer 116. In some embodiments, the first insulating layer 124 may be a single layer formed of a silicon oxide ($SiO_2$) layer. In certain embodiments, the first insulating layer 124 may have a structure in which first sub-insulating layers 124a and second sub-insulating layers 124b are alternately repeatedly stacked, as illustrated in FIG. 4A. Here, refractive indexes of the first and second sub-insulating layers 124a and 124b may be lower than the refractive index of the second semiconductor layer 116 and may be different from each other. For example, the first sub-insulating layer 124a may be formed of a silicon oxide ($SiO_2$) layer, and the second sub-insulating layer 124b may be formed of a titanium oxide ($TiO_2$) layer or a niobium oxide ($Nb_2O_5$) layer. Thus, the first insulating layer 124 may have an omnidirectional reflective (ODR) structure or a distributed Bragg reflective (DBR) structure.

The first insulating layer 124 may have a plurality of openings OP1 and OP2. The plurality of openings OP1 and OP2 may include a first opening OP1 and a second opening OP2, which have widths different from each other. The first and second openings OP1 and OP2 may have opened-hole shapes completely penetrating the first insulating layer 124. The first opening OP1 may penetrate the first insulating layer 124 disposed on the first region R1 of the light-emitting structure 110 to expose the top surface of the first semiconductor layer 112. The second opening OP2 may penetrate the first insulating layer 124 disposed on the second region R2 of the light-emitting structure 110 to expose the top surface of the first sub-electrode layer 122. The first opening OP1 may be used as a connection path through which a first electrode 130a (to be described later) is connected to the first semiconductor layer 112, and the second opening OP2 may be used as a connection path through which a second sub-electrode layer 126 (to be described later) is connected to the first sub-electrode layer 122.

Each of the first and second openings OP1 and OP2 may have a, e.g., circular, planar shape. However, embodiments are not limited thereto. In certain embodiments, one or all of the first and second openings OP1 and OP2 may have a polygonal planar shape, e.g., a quadrilateral planar shape. The first opening OP1 may have a first width W1 (or a first diameter), and the second opening OP2 may have a second width W2 (or a second diameter). As illustrated in FIGS. 3A and 4A, each of the first and second openings OP1 and OP2 may have a width which becomes progressively smaller toward the growth substrate 100, e.g., the W1 and W2 decrease as a distance from the growth substrate 100 decreases. At this time, the first width W1 may correspond to the minimum width of the first opening OP1 (i.e., a width of a bottom end of the first opening OP1). Likewise, the second width W2 may correspond to the minimum width of the second opening OP2 (i.e., a width of a bottom end of the second opening OP2). In some embodiments, the second width W2 may be smaller than 10 μm, e.g., the second width W2 may be equal to or greater than 1 μm and smaller than 10 μm. The first width W1 may be greater than the second width W2.

Each of the first and second openings OP1 and OP2 may be provided in plurality. The plurality of first openings OP1 may be two-dimensionally arranged. For example, as illustrated in FIG. 2A, the plurality of first openings OP1 may be arranged in a first direction D1 and a second direction D2 intersecting (e.g., perpendicular to) the first direction D1 to constitute a plurality of rows and a plurality of columns. At this time, distances, each of which is between the first openings OP1 adjacent to each other in the first direction D1 or the second direction D2, may be equal to each other or different from each other. For example, as illustrated in FIG. 2B, the plurality of second openings OP2 may be two-dimensionally arranged, and may be arranged at equal distances along the first direction D1 and/or the second direction D2. The widths and the arrangement relationships of the first and second openings OP1 and OP2 may influence current diffusion and light extraction efficiency. Thus, the widths and the arrangement relationships of the first and second openings OP1 and OP2 may be limited to improve the current diffusion and the light extraction efficiency. In the present specification, a distance or a pitch of openings may be defined as a distance between centers of openings adjacent to each other. The widths and the arrangement relationships of the first and second openings OP1 and OP2 will be described later in more detail.

In some embodiments, the first insulating layer 124 may further include connection openings COP. Each of the connection openings COP may connect the first openings OP1 adjacent to each other in the second direction D2. The connection opening COP may be disposed between the first openings OP1 adjacent to each other in the second direction D2 to have a long shape in the second direction D2, when viewed in a plan view. A width of the connection opening COP in the first direction D1 may be smaller than the first width W1 of the first opening OP1.

A second sub-electrode layer 126 may be disposed on the second region R2 of the light-emitting structure 110. On the second region R2, the second sub-electrode layer 126 may cover the top surface of the first insulating layer 124 and may extend into the second openings OP2. The second sub-electrode layer 126 may be in contact with the first sub-electrode layer 122 exposed through the second openings OP2. In some embodiments, the second sub-electrode layer 126 may partially fill the second openings OP2. In other words, the second sub-electrode layer 126 may conformally cover the top surface of the first insulating layer 124 and inner surfaces of the second openings OP2. In certain embodiments, the second sub-electrode layer 126 may completely fill the second openings OP2, as illustrated in FIG. 4B. When the second width W2 is small (i.e., the second openings OP2 are narrow), the second openings OP2 may be completely filled with the second sub-electrode layer 126 during the formation of the second sub-electrode layer 126. The second sub-electrode layer 126 may include a reflective metal material, e.g., silver (Ag) or aluminum (Al). In particular, the second sub-electrode layer 126 may include silver (Ag).

In certain embodiments, an additional transparent electrode layer 122a may be disposed between the first insulating layer 124 and the second sub-electrode layer 126 and between the first sub-electrode layer 122 and the second sub-electrode layer 126, as illustrated in FIG. 4C. In other words, the additional transparent electrode layer 122a may be disposed under the second sub-electrode layer 126 to conformally cover the top surface of the first insulating layer 124 and the inner surfaces of the second openings OP2. The additional transparent electrode layer 122a may include the same material as the first sub-electrode layer 122.

A second insulating layer 128 may be disposed on the first and second regions R1 and R2 of the light-emitting structure 110. The second insulating layer 128 may cover the second sub-electrode layer 126 and the first insulating layer 124 exposed by the second sub-electrode layer 126. The second insulating layer 128 may include sidewalls having profiles which are continuous with sidewalls of the first openings OP1. In other words, the first openings OP1 may extend into the second insulating layer 128 to penetrate the second insulating layer 128. The second insulating layer 128 may include at least one third opening OP3 exposing a portion of the second sub-electrode layer 126. The second insulating layer 128 may include, e.g., a silicon oxide layer.

Reflective metal layers 130a and 130b may be disposed on the second insulating layer 128 overlapping with the second region R2. The reflective metal layers 130a and 130b may include a first reflective metal layer 130a connected to the first semiconductor layer 112 exposed through the first opening OP1, and a second reflective metal layer 130b connected to the second sub-electrode layer 126 exposed through the third opening OP3. The first reflective metal layer 130a may extend onto the first region R1 to partially fill the first opening OP1. In other words, the first reflective metal layer 130a may be in, e.g., direct, contact with the first semiconductor layer 112 exposed through the first opening OP1. In addition, the first reflective metal layer 130a may conformally cover an inner surface of the first opening OP1. The second reflective metal layer 130b may be electrically insulated from the first reflective metal layer 130a and the first semiconductor layer 112. The first and second reflective metal layers 130a and 130b may include a reflective metal material, e.g., silver (Ag) or aluminum (Al). In particular, the first and second reflective metal layers 130a and 130b may include aluminum (Al).

A first metal interconnection 142 may be disposed on the first reflective metal layer 130a and may be in contact with the first reflective metal layer 130a. The first metal interconnection 142 may completely or partially fill the first opening OP1 in which the first reflective metal layer 130a is disposed. A second metal interconnection 144 may be disposed on the second reflective metal layer 130b and may be in contact with the second reflective metal layer 130b. The second metal interconnection 144 may completely or partially fill the third opening OP3 in which the second reflective metal layer 130b is disposed. The first and second metal interconnections 142 and 144 may include at least one of, e.g., aluminum (Al), chromium (Cr), titanium (Ti), copper (Cu), or any alloy thereof.

As illustrated in FIG. 3B, a protection layer 150 may be disposed on the first and second metal interconnections 142 and 144. The protection layer 150 may partially expose each of the first and second metal interconnections 142 and 144. The protection layer 150 may include a passivation insulating layer, e.g., a silicon oxide layer and/or a silicon nitride layer.

A first UBM pattern 152 and a second UBM pattern 154 may be disposed on the first and second metal interconnections 142 and 144 exposed by the protection layer 150, respectively. Thus, the first UBM pattern 152 may be electrically connected to the first semiconductor layer 112 through the first metal interconnection 142 and the first reflective metal layer 130a. The second UBM pattern 154 may be electrically connected to the second semiconductor layer 116 through the second metal interconnection 144, the second reflective metal layer 130b, the second sub-electrode layer 126, and the first sub-electrode layer 122. The first and second UBM patterns 152 and 154 may include a single metal or alloy including at least one of, e.g., titanium (Ti), tungsten-titanium (TiW), chromium (Cr), copper (Cu), nickel (Ni), gold (Au), lead (Pd), or silver (Ag).

The first reflective metal layer 130a, which is connected to the first semiconductor layer 112 and is electrically connected to the first UBM pattern 152 through the first metal interconnection 142, may be defined as a first electrode 130a. The first insulating layer 124 and the first and second sub-electrode layers 122 and 126 connected to each other through the second openings OP2 of the first insulating layer 124 may be defined as a second electrode 120. The second electrode 120 may be in contact with the second semiconductor layer 116 and may be electrically connected to the second UBM pattern 154 through the second reflective metal layer 130b and the second metal interconnection 144. The sub-electrode layers 122 and 126, the reflective metal layers 130a and 130b, the metal interconnections 142 and 144, the insulating layers 124 and 128, the protection layer 150, and the UBM patterns 152 and 154 may constitute the electrode structure 160 of FIG. 1.

According to some embodiments, a reflector layer having a multi-layered structure including the sub-electrode layers 122 and 126, the insulating layers 124 and 128, and the reflective metal layers 130a and 130b may be provided on the light-emitting structure 110. Thus, reflectivity of the semiconductor light-emitting device 20 may be improved to increase the light extraction efficiency. In particular, the first insulating layer 124 may have a lower refractive index than the second semiconductor layer 116 and/or may have the ODR or DBR structure. Thus, when the light emitted from the active layer 114 reaches the first insulating layer 124, the amount of light reflection may be larger than the amount of light absorption. In addition, as illustrated in FIG. 3B, the first insulating layer 124 may extend onto the first region R1 formed along an edge of the light-emitting structure 110, and thus a high-reflection region may be realized in an entire region of the light-emitting structure 110.

On the other hand, when areas of the first and second openings OP1 and OP2 increase, an area of the first insulating layer 124 may decrease but a contact area of the first semiconductor layer 112 and the first reflective metal layer 130a and a contact area of the first and second sub-electrode layers 122 and 126 may increase. In other words, the increase in area of the first and second openings OP1 and OP2 may reduce an operating voltage to improve electrical characteristics of the semiconductor light-emitting device 20 but may cause the reduction of the reflectivity of the semiconductor light-emitting device 20 to reduce the light extraction efficiency of the semiconductor light-emitting device 20. Thus, the areas of the first and second openings OP1 and OP2 may be properly limited to harmonize the light extraction efficiency and the electrical characteristics which are in a trade-off relationship.

The areas of the first and second openings OP1 and OP2 may be adjusted by the widths and the arrangement relationships of the first and second openings OP1 and OP2. According to some embodiments, the first openings OP1 may have a smaller total area than the second openings OP2 in consideration of characteristics of the first semiconductor layer 112 having a lower electrical resistance than the second semiconductor layer 116. For example, as illustrated in FIG. 2B, the first width W1 of the first openings OP1 may be greater than the second width W2 of the second openings OP2. However, a first distance between the first openings OP1 adjacent to each other (e.g., a first pitch P1 between the first openings OP1 adjacent to each other in the second direction D2 in FIG. 2B) may be greater than a second distance between the second openings OP2 (e.g., a second pitch P2 between the second openings OP2 adjacent to each other in the first and/or second direction D1 and D2 in FIG. 2). Thus, a total number of the first openings OP1 may be much smaller than a total number of the second openings OP2. As a result, the total area of the first openings OP1 may be smaller than a total area of the second openings OP2. Here, the total area of the first openings OP1 may be a sum of the areas of the first openings OP1, and the total area of the second openings OP2 may be a sum of the areas of the second openings OP2. For example, if the first and second openings OP1 and OP2 have circular shapes in plan view, an area of one opening may be an are of a widest circle in each opening, i.e., as measured at the top of the opening with the largest diameter.

In addition, the distances between the first openings OP1 may be equal to each other, or the first openings OP1 may be randomly distributed. On the other hand, the second openings OP2 may be arranged at equal distances. In some embodiments, as illustrated in FIG. 5A, the second openings OP2 may be arranged in the first direction D1 and the second direction D2 intersecting (e.g., perpendicular to) the first direction D1 to constitute a plurality of rows and a plurality of columns. At this time, the second distance P2 between the second openings OP2 adjacent to each other in the first direction D1 or the second direction D2 may be constant. The second distance P2 may be defined as a distance between centers of the second openings OP2 adjacent to each other in the first direction D1 or the second direction D2 when viewed in a plan view. In the present embodiment, the centers of four second openings OP2 adjacent to each other may form a square.

In certain embodiments, as illustrated in FIG. 5B, the second openings OP2 may be arranged in a zigzag form along the first direction D1 and the second direction D2. In other words, the second openings OP2 may be arranged in a honeycomb form when viewed in a plan view. At this time, second distances d, each of which is between the second openings OP2 closest to each other, may be equal to each other. In the present embodiment, centers of the second openings OP2 arranged in a triangular form may form an equilateral triangle.

In certain embodiments, as illustrated in FIG. 5C, each of the second openings OP2 may have a polygonal planar shape such as a quadrilateral shape. For example, each of the first openings OP1 may have a polygonal planar shape such as a quadrilateral shape.

According to some embodiments, the second width W2 of the second openings OP2 may be smaller than 10 µm to achieve a desired light efficiency (lm/W) of the semiconductor light-emitting device 20. Here, the light efficiency (lm/W) may be defined as a value obtained by dividing a luminous flux (lm) of the semiconductor light-emitting device 20 by a power consumption (W). In some embodiments, each of the second openings OP2 may have a circular planar shape, and the second width W2 may be equal to or greater than 1 µm and smaller than 10 µm. In addition, the second distance P2 or d between the second openings OP2 adjacent to each other may range from about 10 µm to about 50 µm. On the other hand, some of the second openings OP2 may be regularly and asymmetrically arranged in a local area to avoid overlap with a structure of another layer.

When the second width W2 of the second openings OP2 is increased to increase the total area of the second openings OP2, both the luminous flux (lm) and the power consumption (W) may be reduced. When the second distance P2 or d between the second openings OP2 is increased to reduce the total area of the second openings OP2, both the luminous flux (lm) and the power consumption (W) may be increased. Thus, the second width W2 and the second distance P2 or d of the second openings OP2 may be properly limited to achieve the desired light efficiency (lm/W).

As illustrated in FIG. 6, in the case in which the width of the second opening OP2 is 10 μm, a desired light efficiency value T is not achieved regardless of the distance (i.e., the pitch) between the second openings OP2. On the contrary, when the second width W2 of the second opening OP2 is smaller than 10 μm, the desired light efficiency value T can be achieved in the case in which the second distance P2 or d between the second openings OP2 ranges from about 10 μm to about 50 μm. As a result, to achieve the desired light efficiency (lm/W) of the semiconductor light-emitting device 20, the second openings OP2 may have the second width W2 being equal to or greater than 1 μm and smaller than 10 μm and the second distance P2 or d ranging from about 10 μm to about 50 μm. A method for manufacturing the semiconductor light-emitting device 20 will be described hereinafter.

FIGS. 7 to 12 are cross-sectional views taken along line I-I' of FIG. 2B to illustrate stages in a method for manufacturing a semiconductor light-emitting device, according to some embodiments. Hereinafter, the same descriptions as explained above will be omitted or mentioned only briefly for the purpose of ease and convenience in explanation.

Figure 7:
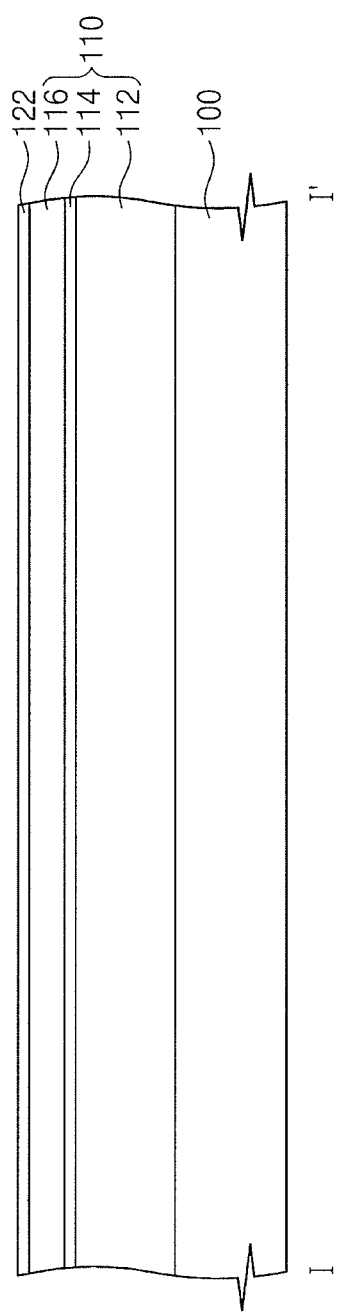

Referring to FIGS. 2B and 7, the light-emitting structure 110 may be formed on a growth substrate 100. he light-emitting structure 110 may include the first semiconductor layer 112, the active layer 114, and the second semiconductor layer 116, which are sequentially stacked on the growth substrate 100. For example, the first semiconductor layer 112 may be formed of P-type GaN, and the second semiconductor layer 116 may be formed of N-type GaN. For example, the active layer 114 may be formed by alternately stacking quantum well layers formed of InGaN and quantum barrier layers formed of GaN. Each of the first semiconductor layer 112, the active layer 114, and the second semiconductor layer 116 may be formed by a process, e.g., a metal organic chemical vapor deposition (MOCVD) process, a hydride vapor phase epitaxy (HVPE) process, or a molecular beam epitaxy (MBE) process.

A first sub-electrode layer 122 may be formed on an entire top surface of the second semiconductor layer 116. For example, the first sub-electrode layer 122 may be formed of a transparent conductive oxide.

Figure 8:
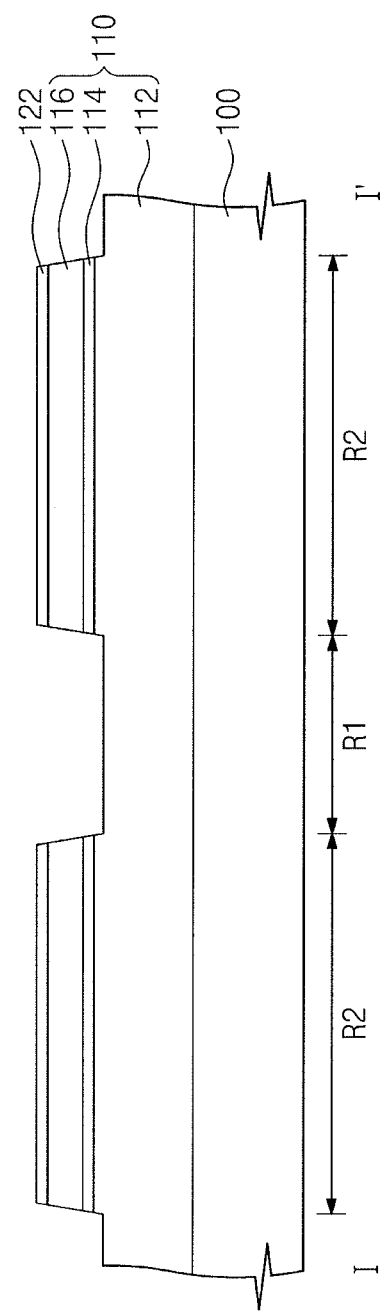

Referring to FIGS. 2B and 8, a portion of the light-emitting structure 110 may be etched to expose a portion of the first semiconductor layer 112. Thus, the light-emitting structure 110 may be divided into the first region R1 exposing the top surface of the first semiconductor layer 112, and the second region R2 not etched during the formation of the first region R1. The first region R1 may be formed in plurality, and the plurality of first regions R1 may be two-dimensionally arranged. The first sub-electrode layer 122 may be partially etched during the formation of the first region R1. Thus, a sidewall of the first sub-electrode layer 122 may have a profile continuous with a sidewall of the second region R2.

Referring to FIGS. 2B and 9, the first insulating layer 124 may be formed on the light-emitting structure 110. The first insulating layer 124 may cover the top surface of the first semiconductor layer 112 and a top surface of the first sub-electrode layer 122. The first insulating layer 124 may be formed of an insulating material having a lower refractive index than the second semiconductor layer 116 and/or may be formed to have an omnidirectional reflective (ODR) structure or a distributed Bragg reflective (DBR) structure. For example, the first insulating layer 124 may be formed of a silicon oxide ($SiO_2$) layer. In another example, the first insulating layer 124 may be formed to have a structure including silicon oxide ($SiO_2$) layers and titanium oxide ($TiO_2$) layers alternately and repeatedly stacked. In yet another example, the first insulating layer 124 may have a structure including silicon oxide ($SiO_2$) layers and niobium oxide ($Nb_2O_5$) layers alternately and repeatedly stacked. The first insulating layer 124 may be formed by a deposition process, e.g., a chemical vapor deposition (CVD) process or a physical vapor deposition (PVD) process.

Next, the second openings OP2 may be formed in the first insulating layer 124. The second opening OP2 may penetrate the first insulating layer 124 to expose the top surface of the first sub-electrode layer 122. The second openings OP2 may have the second width W2 and may be formed to be periodically arranged. The width and arrangement relationship of the second openings OP2 may be the same as described with reference to FIGS. 2A to 6.

Referring to FIGS. 2B and 10, a second sub-electrode layer 126 may be formed to cover the top surface of the first insulating layer 124 on the second region R2 and to partially fill the second openings OP2. The second sub-electrode layer 126 may be in contact with the first sub-electrode layer 122. For example, a reflective metal layer may be deposited on the growth substrate 100 by a deposition process such as a PVD process, and the deposited reflective metal layer may be patterned to form the second sub-electrode layer 126. The reflective metal layer may include, e.g., silver (Ag) or aluminum (Al). The second sub-electrode layer 126 may expose the first insulating layer 124 disposed on the first region R1. In certain embodiments, the second sub-electrode layer 126 may completely fill the second openings OP2.

Figure 11:
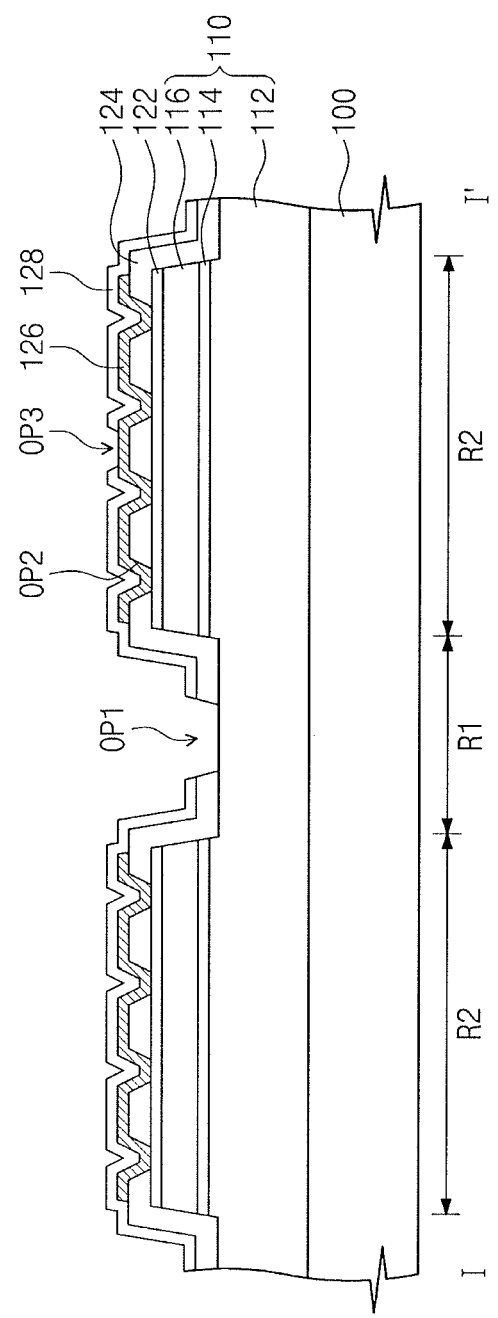

Referring to FIGS. 2B and 11, a second insulating layer 128 may be formed on the growth substrate 100 having the second sub-electrode layer 126. The second insulating layer 128 may cover a top surface of the second sub-electrode layer 126 and a top surface of the first insulating layer 124 of the first region R1. The second insulating layer 128 may include, e.g., a silicon oxide layer and may be formed by a deposition process such as a CVD process.

Subsequently, portions of the second and first insulating layers 128 and 124 of the first region R1 may be removed to form the first opening OP1 exposing the top surface of the first semiconductor layer 112. A portion of the second insulating layer 128 of the second region R2 may be removed to form the third opening OP3 exposing the second sub-electrode layer 126.

Figure 12:
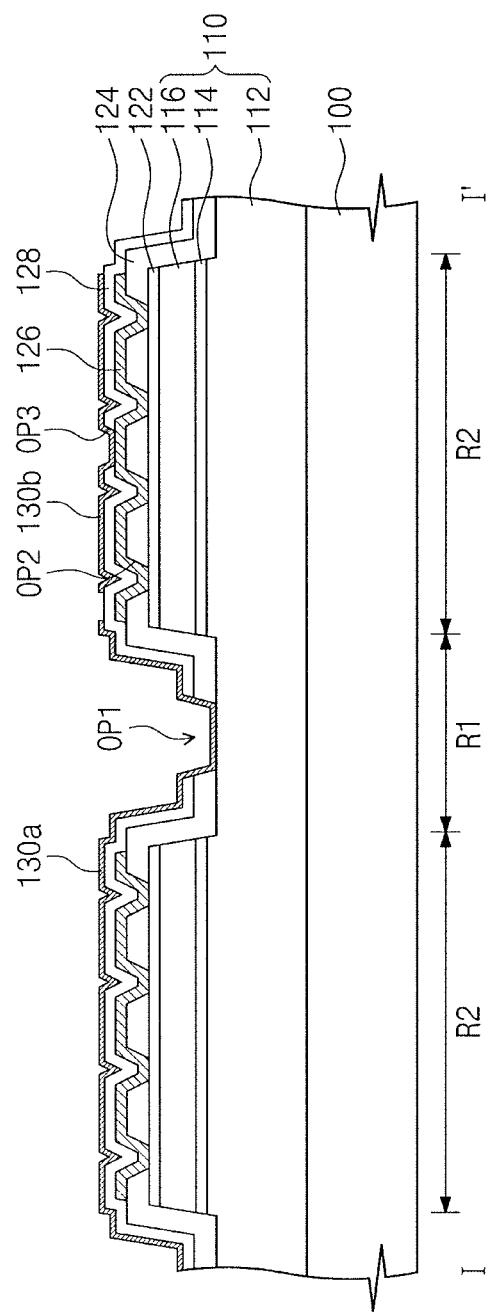

Referring to FIGS. 2B and 12, first and second reflective metal layers 130a and 130b may be formed on the second insulating layer 128. The first reflective metal layer 130a may be formed to partially fill the first opening OP1 and to conformally cover an inner surface of the first opening OP1. The second reflective metal layer 130b may be formed to be connected to the second sub-electrode layer 126 exposed through the third opening OP3 on the second insulating layer 128 overlapping with the second region R2. The second reflective metal layer 130b may be electrically insulated from the first reflective metal layer 130a and the first semiconductor layer 112.

Referring again to FIGS. 2A, 2B, 3A, and 3B, first and second metal interconnections 142 and 144 may be formed. The first metal interconnection 142 may be in contact with the first reflective metal layer 130a, and the second metal interconnection 144 may be in contact with the second reflective metal layer 130b. The first and second metal interconnections 142 and 144 may be spaced apart from each other and may be electrically insulated from each other. For example, a metal layer may be formed on the resultant structure of FIG. 12 by a deposition process such as a PVD process, and the metal layer may be patterned to form the first and second metal interconnections 142 and 144. The metal layer may include at least one of, e.g., aluminum (Al), chromium (Cr), titanium (Ti), copper (Cu), or any alloy thereof.

Next, the protection layer 150 may be formed to partially expose the first and second metal interconnections 142 and 144, and first and second UBM patterns 152 and 154 may be formed on the first and second metal interconnections 142 and 144 exposed by the protection layer 150, respectively. Thus, the manufacture of the semiconductor light-emitting device 20 may be completed.

Figure 13:
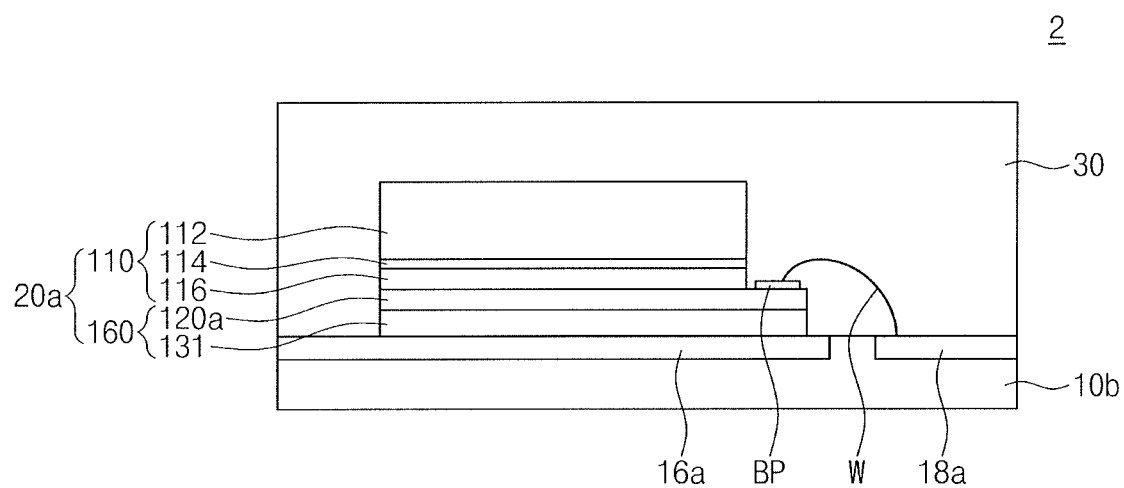
FIG. 13 illustrates a schematic cross-sectional view of a semiconductor light-emitting device package according to some embodiments.

FIG. 13 is a schematic cross-sectional view illustrating a semiconductor light-emitting device package according to some embodiments. Hereinafter, differences between the semiconductor light-emitting device package of the present embodiment and the semiconductor light-emitting device packages 1a and 1b of FIGS. 1A and 1B will be mainly described for the purpose of ease and convenience in explanation.

Referring to FIG. 13, a semiconductor light-emitting device package 2 according to some embodiments may include a mounting substrate 10b, a semiconductor light-emitting device 20a, and a sealing layer 30. The semiconductor light-emitting device 20a may include the light-emitting structure 110 and an electrode structure 160. The light-emitting structure 110 may include the first and second semiconductor layers 112 and 116 having different conductivity types, and the active layer 114 disposed between the first and second semiconductor layers 112 and 116. The electrode structure 160 may include a first electrode 131 electrically connected to the first semiconductor layer 122 and a second electrode 120a electrically connected to the second semiconductor layer 116.

The semiconductor light-emitting device 20a may be mounted on a first circuit pattern 16a of the mounting substrate 10b with a conductive adhesive member interposed therebetween. The conductive adhesive member may electrically connect the first circuit pattern 16a of the mounting substrate 10b to the first electrode 131 of the semiconductor light-emitting device 20a. In the present embodiment, a partial region of the light-emitting structure 110 may be completely removed to expose the second electrode 120a. A bonding pad BP for wire bonding may be disposed on the exposed second electrode 120a. A wire W may electrically connect the second electrode 120a of the semiconductor light-emitting device 20a to a second circuit pattern 18a of the mounting substrate 10b. The wire W may include, e.g., gold (Au).

The sealing layer 30 may seal the semiconductor light-emitting device 20a. For example, the sealing layer 30 may include a resin in which a fluorescent substance is dispersed. The fluorescent substance may include. e.g., a green fluorescent substance and/or a red fluorescent substance.

Electron-hole recombination may occur in the active layer 114 by an electrical signal applied to the mounting substrate 10b. Light generated by the electron-hole recombination may be emitted upward through the first semiconductor layer 112. The semiconductor light-emitting device 20a according to some embodiments will be described hereinafter in more detail.

Figure 14:
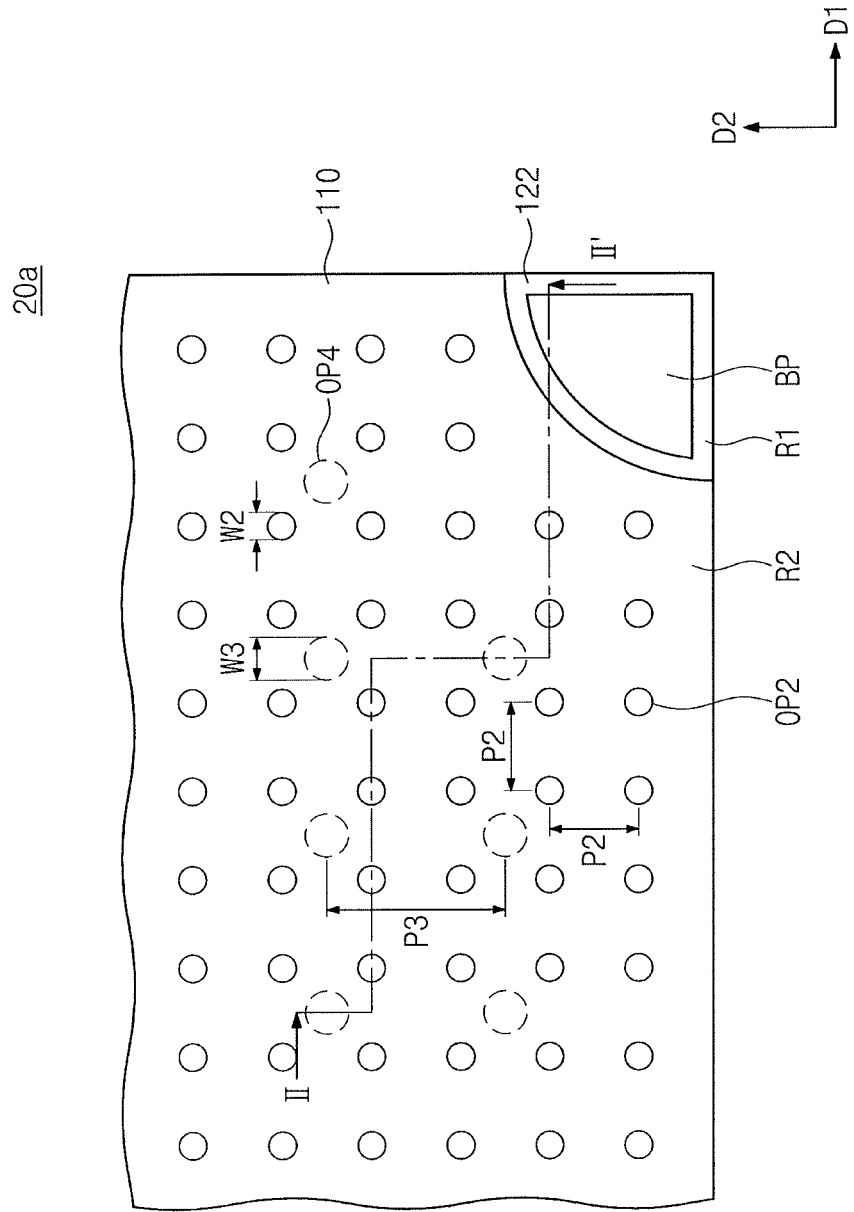
FIG. 14 illustrates a schematic plan view of a semiconductor light-emitting device according to some embodiments.
Figure 15:
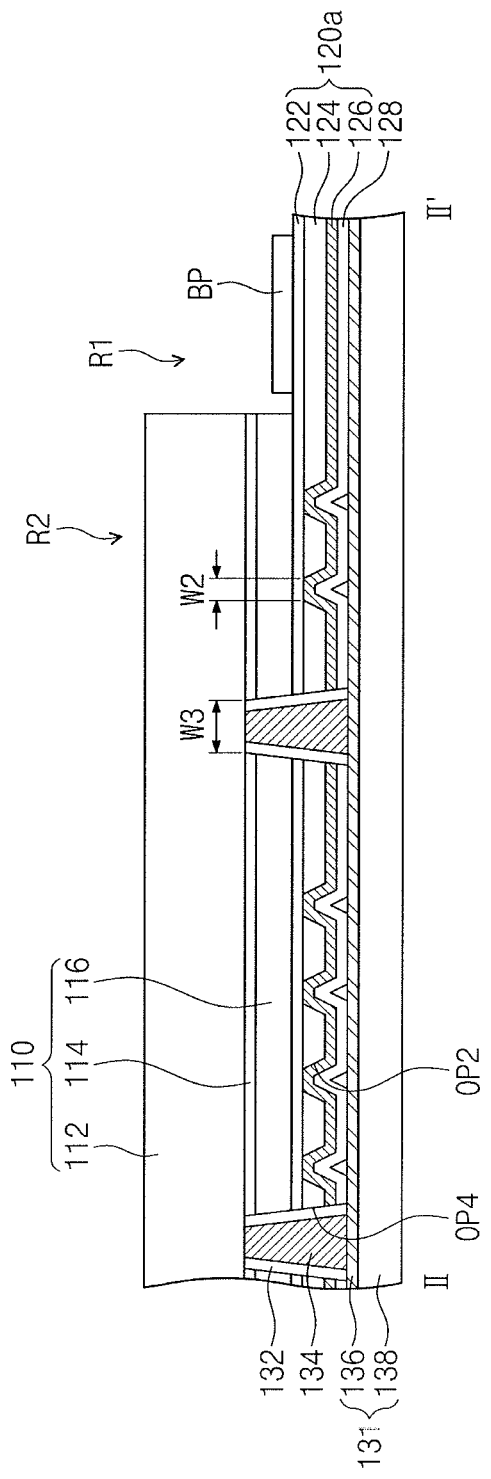
FIG. 15 illustrates a cross-sectional view along line II-II' of FIG. 14.

FIG. 14 is a schematic plan view illustrating the semiconductor light-emitting device 20a. FIG. 15 is a cross-sectional view taken along line II-II' of FIG. 14. Hereinafter, the same descriptions as explained above will be omitted or mentioned briefly for the purpose of ease and convenience in explanation.

Referring to FIGS. 14 and 15, the semiconductor light-emitting device 20a may include the light-emitting structure 110 and the electrode structure 160. In the present embodiment, the growth substrate 100 is removed. The light-emitting structure 110 may include the first and second semiconductor layers 112 and 116 having different conductivity types, and the active layer 114 disposed between the first and second semiconductor layers 112 and 116. The first and second semiconductor layers 112 and 116 may include the same materials as described with reference to FIGS. 2A, 2B, 3A, 3B, and 4A. The electrode structure 160 may include the first electrode 131 disposed on a bottom surface of the second semiconductor layer 116, and the second electrode 120a disposed between the first electrode 131 and the second semiconductor layer 116.

The light-emitting structure 110 may include the first region R1 and the second region R2. The first region R1 may correspond to an etched region of the light-emitting structure 110, which is completely removed to expose the second electrode 120a of the electrode structure 160. The second region R2 may correspond to a remaining region (i.e., a mesa region) of the light-emitting structure 110, which is not etched during the formation of the first region R1.

The second electrode 120a may include the first sub-electrode layer 122, the first insulating layer 124, and the second sub-electrode layer 126, which are sequentially stacked on the bottom surface of the second semiconductor layer 116. The first insulating layer 124 may include the plurality of second openings OP2, and the second sub-electrode layer 126 may be in contact with the first sub-electrode layer 122 through the second openings OP2. The first sub-electrode layer 122, the first insulating layer 124, and the second sub-electrode layer 126 may have the same or similar materials, structures, and/or components as the first sub-electrode layer 122, the first insulating layer 124, and the second sub-electrode layer 126 described with reference to FIGS. 2A, 2B, 3A, 3B, and 4A, respectively. In addition, the second width W2, the second distance P2 and arrangement relationship of the second openings OP2 may be the same or similar as described with reference to the semiconductor light-emitting device 20. The second electrode 120a may function as the reflector layer having the multi-layered structure, like the electrode 120 of the semiconductor light-emitting device 20. Even though not shown in the drawings, the embodiments of FIGS. 4B, 4C, 5A, 5B, and 5C may also be applied to the semiconductor light-emitting device 20a.

The second insulating layer 128 may be disposed between the second electrode 120a and the first electrode 131 to electrically insulate the first and second electrodes 131 and 120a from each other. The second insulating layer 128 may include, e.g., a silicon oxide layer.

The first electrode 131 may include a conductive adhesive layer 136 and a conductive substrate 138 which are sequentially stacked on a bottom surface of the second insulating layer 128. The conductive adhesive layer 136 may be formed of a conductive material, e.g., a metal layer. When the conductive adhesive layer 136 is the metal layer, the metal layer may include at least one of, but not limited to, Au, Ag, Pt, Ni, Cu, Sn, Al, Pb, Cr, or Ti. For example, the conductive substrate 138 may include silicon, strained silicon, a silicon alloy, silicon-on-insulator (SOI), silicon carbide (SiC), silicon-germanium (SiGe), silicon-germanium carbide (SiGeC), germanium, a germanium alloy, gallium arsenide (GaAs), indium arsenide (InAs), a III-V group semiconductor, or a II-VI group semiconductor.

The first electrode 131 may be electrically connected to the first semiconductor layer 112 through a connection contact 134. The connection contact 134 may be disposed in a fourth opening OP4 which penetrates the second insulating layer 128, the second electrode 120a, the second semiconductor layer 116, and the active layer 114 to expose the first semiconductor layer 112. The connection contact 134 may include a metal material such as Cu, Al, or W. An insulating spacer 132 may be disposed between the connection contact 134 and a sidewall of the fourth opening OP4. The insulating spacer 132 may include a silicon oxide layer or a silicon nitride layer.

The connection contact 134 may be provided in plurality. In other words, the fourth opening OP4 may be provided in plurality. The plurality of fourth openings OP4 may be two-dimensionally arranged along a first direction D1 and a second direction D2. Like the areas of the first openings OP1, areas of the fourth openings OP4 may also influence the light efficiency of the semiconductor light-emitting device 20a. The fourth openings OP4 may have a smaller total area than the second openings OP2 in consideration of characteristics of the first semiconductor layer 112 having a lower electrical resistance than the second semiconductor layer 116. For example, a third width W3 of the fourth openings OP4 may be greater than the second width W2 of the second openings OP2, and a third distance P3 between the fourth openings OP4 may be greater than the second distance P2 between the second openings OP2. Here, the third width W3 may correspond to the minimum width of the fourth opening OP4 (i.e., a width of a top end of the fourth opening OP4).

On the other hand, the fourth openings OP4 may penetrate the first insulating layer 124, and a portion of the fourth opening OP4 penetrating the first insulating layer 124 may correspond to the first opening OP1 described with reference to FIGS. 2A, 2B, 3A, 3B, and 4A. Since the third width W3 of the fourth opening OP4 is greater than the second width W2, the portion of the fourth opening OP4 penetrating the first insulating layer 124 may have a width greater than the second width W2. As a result, the first insulating layer 124 may have a plurality of openings having different widths. A method for manufacturing the semiconductor light-emitting device 20a will be described hereinafter.

FIGS. 16 to 21 are cross-sectional views taken along the line II-II' of FIG. 14 to illustrate a method for manufacturing a semiconductor light-emitting device, according to some embodiments. Hereinafter, the same descriptions as explained above will be omitted or mentioned briefly for the purpose of ease and convenience in explanation.

Referring to FIGS. 14 and 16, a light-emitting structure 110 may be formed on a growth substrate 100. The light-emitting structure 110 may include a first semiconductor layer 112, an active layer 114, and a second semiconductor layer 116, which are sequentially stacked on the growth substrate 100. Next, a first sub-electrode layer 122 and a first insulating layer 124 may be sequentially formed on the second semiconductor layer 116.

Referring to FIGS. 14 and 17, a plurality of second openings OP2 exposing the first sub-electrode layer 122 may be formed in the first insulating layer 124. For example, the second openings OP2 may be formed to be periodically arranged on a residual region of the light-emitting structure 110 except a region (i.e., a first region R1), to be etched, of the light-emitting structure 110. The second openings OP2 may have a second width W2.

Figure 18:
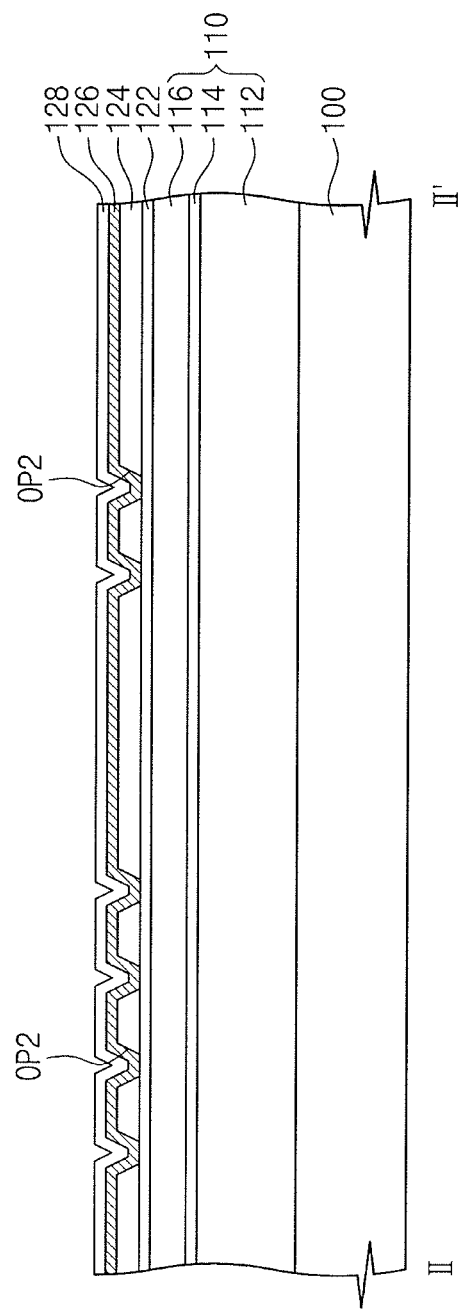

Referring to FIGS. 14 and 18, a second sub-electrode layer 126 may be formed to cover a top surface of the first insulating layer 124 and to partially fill the second openings OP2. The second sub-electrode layer 126 may conformally cover the top surface of the first insulating layer 124 and inner surfaces of the second openings OP2. Next, a second insulating layer 128 may be formed on the second sub-electrode layer 126.

Figure 19:
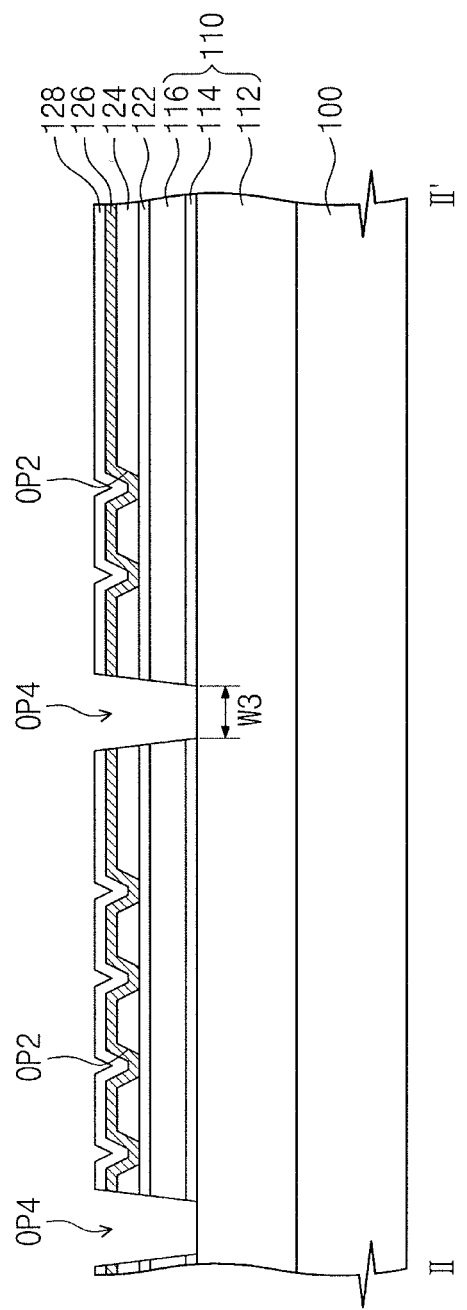

Referring to FIGS. 14 and 19, fourth openings OP4 may be formed to penetrate the second insulating layer 128, the second electrode 120a, the second semiconductor layer 116, and the active layer 114. The fourth openings OP4 may expose the first semiconductor layer 112. The fourth openings OP4 may have a third width W3 greater than the second width W2 and may be two-dimensionally arranged.

Figure 20:
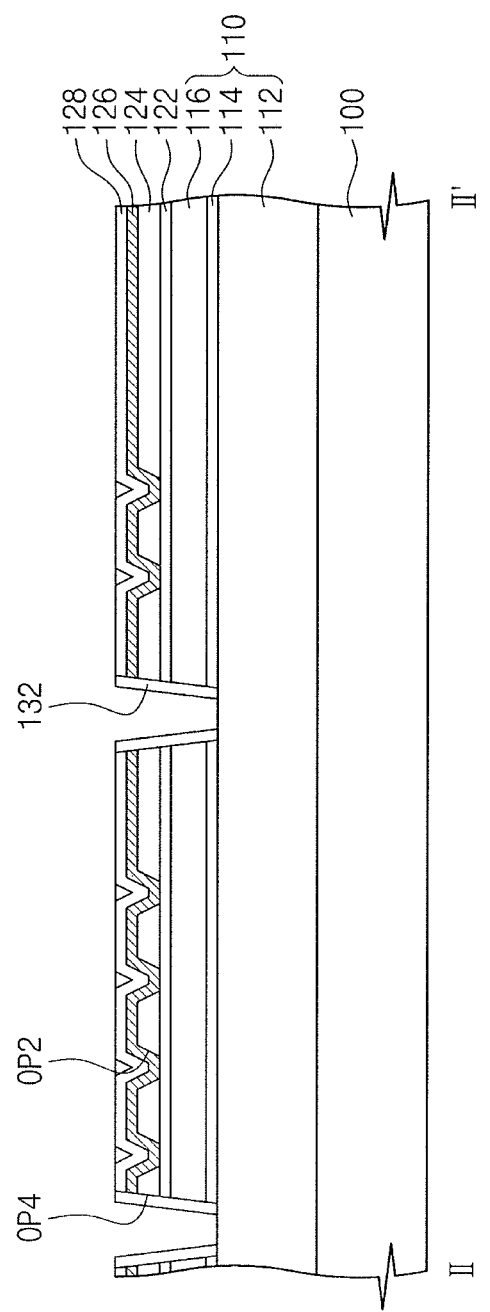

Referring to FIGS. 14 and 20, insulating spacers 132 may be formed on sidewalls of the fourth openings OP4, respectively. For example, an insulating spacer layer may be formed on the growth substrate 100 to conformally cover inner surfaces of the fourth openings OP4, and a blanket anisotropic etching process may be performed on the insulating spacer layer to form the insulating spacers 132. The blanket anisotropic etching process may be performed until bottom surfaces of the fourth openings OP4 (i.e., the top surface of the first semiconductor layer 112) is exposed. The insulating spacer layer may include, for example, a silicon oxide layer or a silicon nitride layer.

Figure 21:
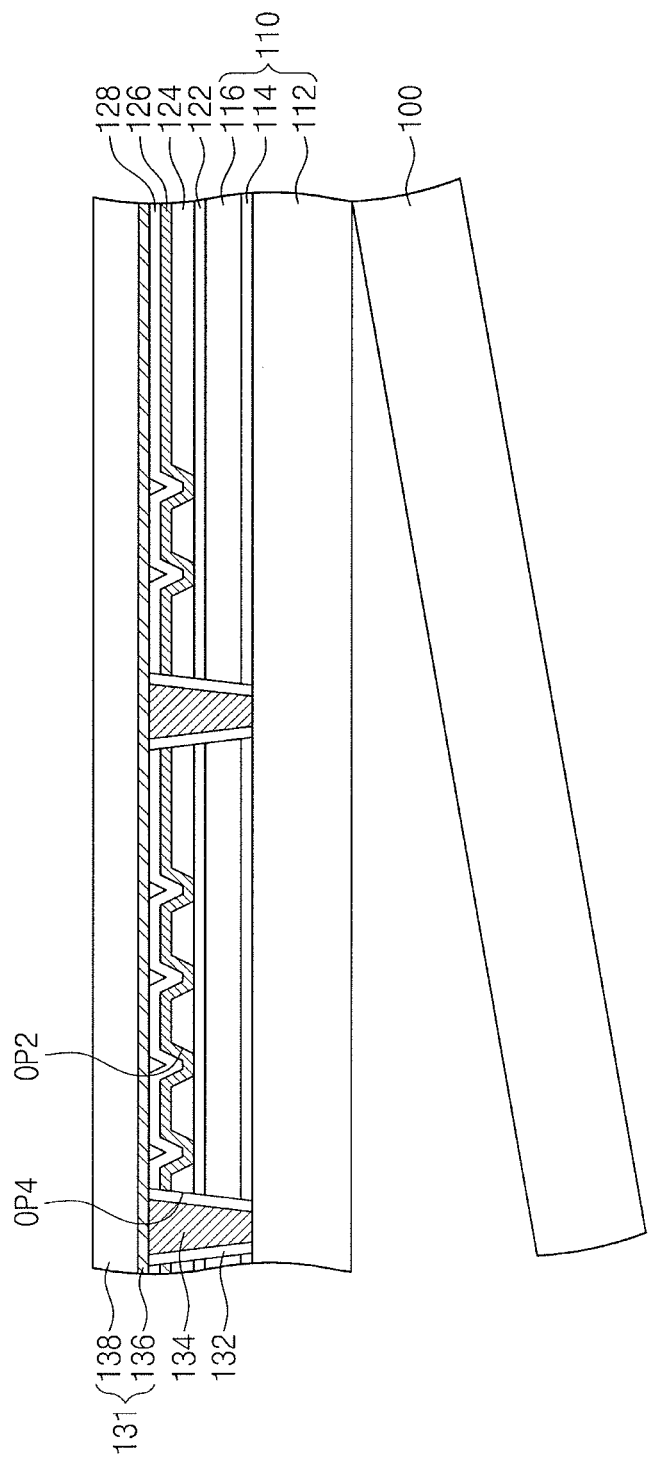

Referring to FIGS. 14 and 21, connection contacts 134 may be formed in the fourth openings OP4, respectively. For example, a conductive layer may be formed on the growth substrate 100 to fill the fourth openings OP4, and a planarization process may be performed on the conductive layer to form the connection contacts 134. For example, the conductive layer may include a metal material such as Cu, Al, or W.

Subsequently, a conductive substrate 138 may be bonded onto the growth substrate 100 with a conductive adhesive layer 136 interposed therebetween. Next, the growth substrate 100 may be removed by, for example, a laser lift-off process. The conductive substrate 138 may support the light-emitting structure 110 in subsequent processes.

Referring again to FIGS. 14 and 15, a partial region of the light-emitting structure 110 may be completely removed to form a first region R1 exposing the first sub-electrode layer 122. Thereafter, a bonding pad BP may be formed on the first sub-electrode layer 112 exposed by the first region R1. Thus, the manufacture of the semiconductor light-emitting device 20a of FIG. 15 may be completed.

Figure 22:
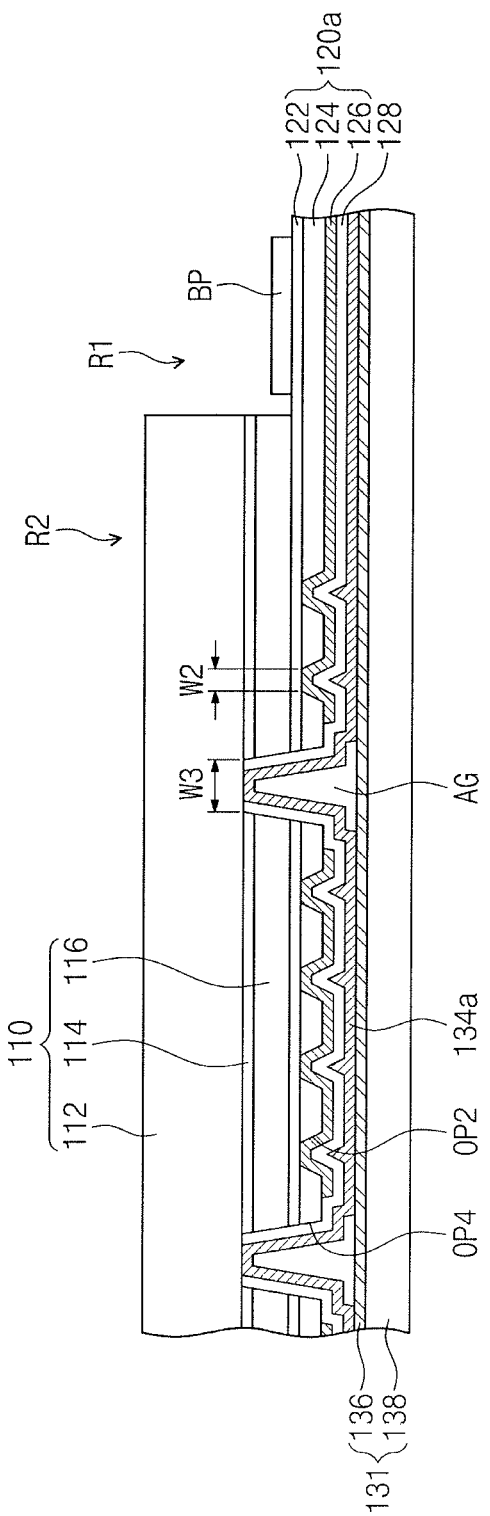
FIG. 22 illustrates a cross-sectional view corresponding to line II-II' of FIG. 14 of a semiconductor light-emitting device according to some embodiments.

FIG. 22 is a cross-sectional view corresponding to the line II-II' of FIG. 14 to illustrate a semiconductor light-emitting device according to some embodiments. Hereinafter, differences between a semiconductor light-emitting device of the present embodiment and the semiconductor light-emitting device 20a of FIGS. 14 and 15 will be mainly described for the purpose of ease and convenience in explanation.

Referring to FIGS. 14 and 22, the second insulating layer 128 between the second electrode 120a and the first electrode 131 may extend into the fourth openings OP4. The second insulating layer 128 may partially fill each of the fourth openings OP4 and may expose the first semiconductor layer 112.

A connection metal layer 134a may be conformally disposed along a profile of the second insulating layer 128 and may be in contact with the first semiconductor layer 112 exposed by the fourth openings OP4. In other words, unlike the connection contact 134 of FIG. 15, the connection metal layer 134a may partially fill each of the fourth openings OP4 and may extend between the second insulating layer 128 and the first electrode 131. Thus, a contact area between the first electrode 131 and the connection metal layer 134a may be increased. The connection metal layer 134a may include the same material (i.e., the metal material such as Cu, Al, or W) as the connection contact 15.

The first electrode 131 may be disposed on the connection metal layer 134a. The first electrode 131 may be electrically connected to the first semiconductor layer 112 through the connection metal layer 134a. In the present embodiment, the connection metal layer 134a may partially fill the fourth openings OP4, and thus empty spaces (e.g., air gaps) AG may be defined in the fourth openings OP4.

Figure 23:
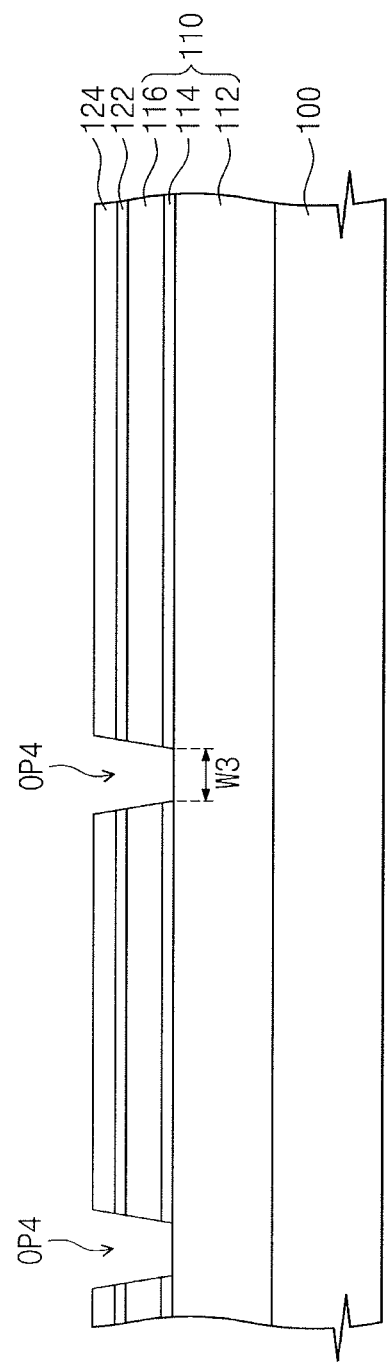
FIGS. 23 to 25 illustrate cross-sectional views corresponding to line II-II' of FIG. 14 of stages in a method for manufacturing a semiconductor light-emitting device, according to some embodiments.
Figure 24:
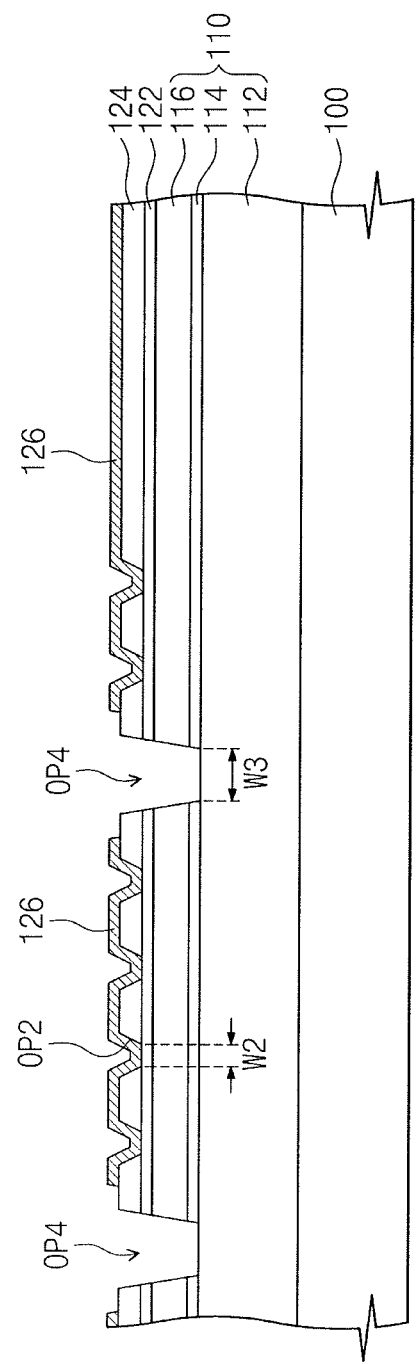
Figure 25:
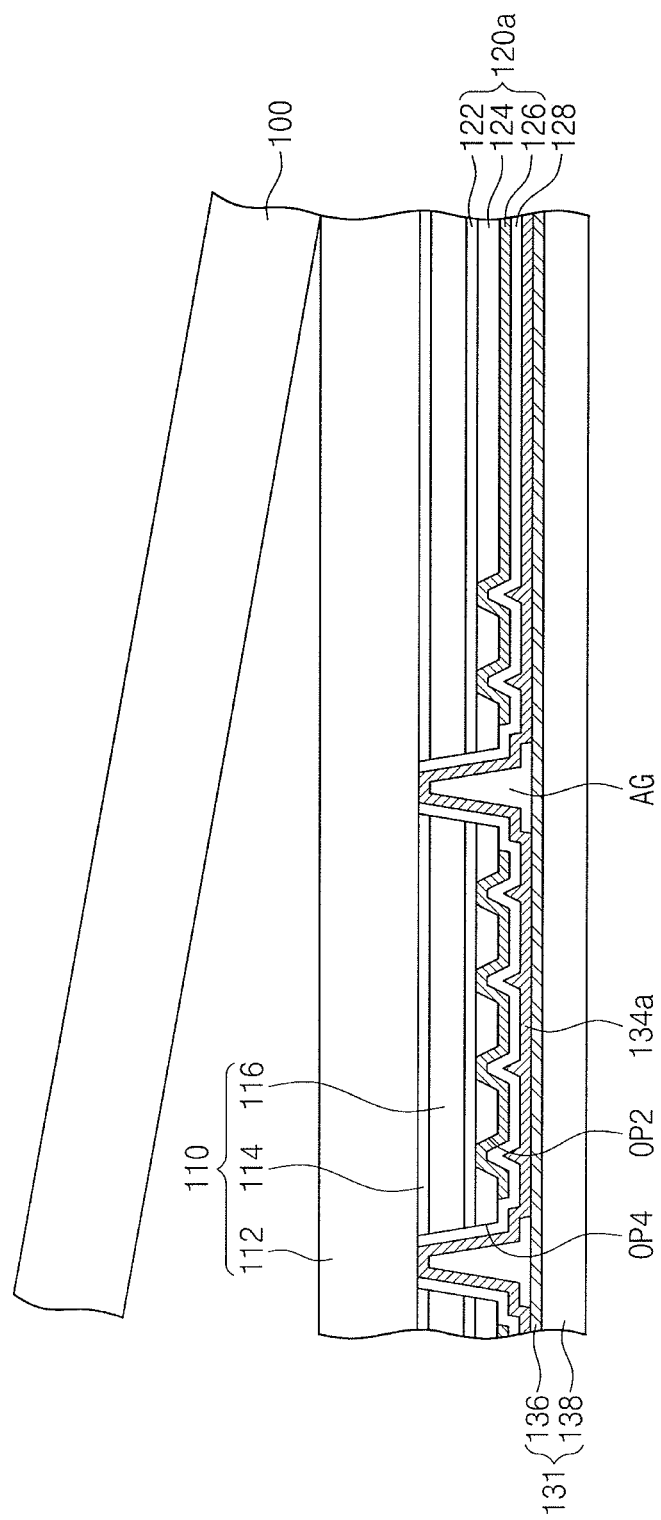

FIGS. 23 to 25 are cross-sectional views corresponding to the line II-II' of FIG. 14 to illustrate a method for manufacturing a semiconductor light-emitting device, according to some embodiments. Hereinafter, the same descriptions as explained above will be omitted or mentioned briefly for the purpose of ease and convenience in explanation.

Referring to FIGS. 14 and 23, a patterning process may be performed on the resultant structure of FIG. 16 to form fourth openings OP4. The fourth openings OP4 may sequentially penetrate the first insulating layer 124, the first sub-electrode layer 122, the second semiconductor layer 116, and the active layer 114 to expose the first semiconductor layer 112. The fourth openings OP4 may have a third width W3 and may be two-dimensionally arranged.

Referring to FIGS. 14 and 24, a plurality of second openings OP2 exposing the first sub-electrode layer 122 may be formed in the first insulating layer 124. The second openings OP2 may be formed to be periodically arranged on a residual region of the light-emitting structure 110 except a region (i.e., a first region R1), to be etched, of the light-emitting structure 110. The second openings OP2 may have a second width W2 smaller than the third width W3.

Next, a second sub-electrode layer 126 may be formed to cover a top surface of the first insulating layer 124 and to partially fill the second openings OP2. The second sub-electrode layer 126 may conformally cover the top surface of the first insulating layer 124 and inner surfaces of the second openings OP2.

Referring to FIGS. 14 and 25, a second insulating layer 128 may be formed to cover the second sub-electrode layer 126 and to extend onto sidewalls of the fourth openings OP4. The second insulating layer 128 may partially fill the fourth openings OP4 and may expose the first semiconductor layer 112.

A connection metal layer 134a may be formed on the second insulating layer 128. The connection metal layer 134a may be conformally formed along a profile of the second insulating layer 128 so as to be in contact with the first semiconductor layer 112 exposed by the fourth openings OP4. The connection metal layer 134a may partially fill residual regions of the fourth openings OP4 in which the second insulating layer 128 is formed. Next, a conductive substrate 138 may be bonded to the growth substrate 100 with a conductive adhesive layer 136 interposed therebetween. Next, the growth substrate 100 may be removed by, for example, a laser lift-off process. The conductive substrate 138 may support the light-emitting structure 110 in subsequent processes.

Referring again to FIGS. 14 and 22, a partial region of the light-emitting structure 110 may be completely removed to form a first region R1 exposing the first sub-electrode layer 122. Thereafter, a bonding pad BP may be formed on the first sub-electrode layer 112 exposed by the first region R1. Thus, the manufacture of the semiconductor light-emitting device of FIG. 22 may be completed.

According to some embodiments, the reflector layer having the multi-layered structure including the sub-electrode layers, the first and second insulating layers, and the reflective metal layers may be provided on the light-emitting structure. Thus, the reflectivity of the semiconductor light-emitting device may be improved to increase the light extraction efficiency. In particular, the first insulating layer may have a lower refractive index than the semiconductor layer of the light-emitting structure or may have the ODR or DBR structure, and thus the reflected amount of light may be larger than the absorbed amount of light when light emitted from the active layer reaches the first insulating layer. In addition, the widths and arrangement relationships of the openings of the first insulating layer may be realized to improve the electrical characteristics of the semiconductor light-emitting device without influence on the light extraction efficiency of the semiconductor light-emitting device. As a result, the semiconductor light-emitting device with improved light efficiency and reliability may be provided, thereby allowing implementation of light sources for large-sized, high-power, and high-efficiency products.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light-emitting device, comprising:
   a light-emitting structure including a first semiconductor layer, an active layer, and a second semiconductor layer which are sequentially stacked;
   a first insulating layer on the second semiconductor layer, the first insulating layer including:
      a plurality of first openings, each of which has a first width, and
      a plurality of second openings, each of which has a second width different from the first width;
   a first electrode electrically connected to the first semiconductor layer through the plurality of first openings;
   a first sub-electrode layer between the second semiconductor layer and the first insulating layer, a top surface of the first sub-electrode layer being exposed through the plurality of second openings; and
   a second sub-electrode layer conformally on the first insulating layer to overlap an entire area of the top surface of the first sub-electrode layer, the second sub-electrode layer being connected to the first sub-electrode layer through the plurality of second openings, wherein a first distance between two adjacent first openings of the plurality of first openings closest to each other is greater than a second distance between two adjacent second openings of the plurality of second openings closest to each other, the first width is greater than the second width, and the first openings directly adjacent to each other have no second openings therebetween.

2. The semiconductor light-emitting device as claimed in claim 1, wherein the second width is smaller than 10 μm, and the second distance ranges from 10 μm to 50 μm.

3. The semiconductor light-emitting device as claimed in claim 1, wherein each of the pluralities of first and second openings has a circular or polygonal planar shape.

4. The semiconductor light-emitting device as claimed in claim 1, wherein the plurality of second openings are arranged along a first direction and a second direction perpendicular to the first direction, and centers of four second openings of the plurality of second openings closest to each other form a square when viewed in a plan view.

5. The semiconductor light-emitting device as claimed in claim 1, wherein the plurality of second openings are arranged in a zigzag form along a first direction or a second direction perpendicular to the first direction, and centers of three second openings of the plurality of second openings closest to each other form an equilateral triangle when viewed in a plan view.

6. The semiconductor light-emitting device as claimed in claim 1, wherein:
the light-emitting structure includes:
a mesa region, and
an etched region having a smaller thickness than the mesa region, the etched region exposing the first semiconductor layer,
the first insulating layer covers the mesa region and the etched region, and
the plurality of first openings penetrate the first insulating layer on the etched region to expose the first semiconductor layer.

7. The semiconductor light-emitting device as claimed in claim 6, wherein the first electrode is in direct contact with the first semiconductor layer through the plurality of first openings.

8. The semiconductor light-emitting device as claimed in claim 1, further comprising connection contacts, each of which penetrates the second sub-electrode layer, each of the plurality of first openings, the first sub-electrode layer, the second semiconductor layer, and the active layer so as to be in contact with the first semiconductor layer,
wherein the first electrode is electrically connected to the first semiconductor layer through the connection contacts.

9. The semiconductor light-emitting device as claimed in claim 8, wherein:
the first electrode includes a conductive substrate on the second sub-electrode layer, and
the semiconductor light-emitting device further includes a second insulating layer between the second sub-electrode layer and the conductive substrate.

10. The semiconductor light-emitting device as claimed in claim 9, wherein a partial region of the light-emitting structure is completely removed to expose the first sub-electrode layer.

11. The semiconductor light-emitting device as claimed in claim 1, wherein the first sub-electrode layer includes a transparent conductive oxide, the second sub-electrode layer includes a reflective metal material.

12. The semiconductor light-emitting device as claimed in claim 11, further comprising an additional transparent electrode layer between the first insulating layer and the second sub-electrode layer, and between the first sub-electrode layer and the second sub-electrode layer.

13. A semiconductor light-emitting device, comprising:
a growth substrate;
a light-emitting structure including:
a first semiconductor layer, an active layer, and a second semiconductor layer which are sequentially stacked on the growth substrate,
first regions exposing the first semiconductor layer, and
a second region thicker than the first regions;
a transparent electrode layer on the second region, the transparent electrode layer being in contact with the second semiconductor layer;
a first insulating layer on the first and second regions, the first insulating layer having first openings exposing the first semiconductor layer and second openings exposing a top surface of the transparent electrode layer;
a reflective metal layer in contact with the first semiconductor layer exposed through the first openings; and
a sub-electrode layer on the first insulating layer on the second region, the sub-electrode layer overlapping an entirety of the top surface of the transparent electrode layer, and being in contact with the transparent electrode layer exposed through the second openings,
wherein a first width of each of the first openings is greater than a second width of each of the second openings,
wherein a first distance between the first openings closest to each other is greater than a second distance between the second openings closest to each other, and
wherein the first openings directly adjacent to each other have no second openings therebetween.

14. The semiconductor light-emitting device as claimed in claim 13, wherein the second width is equal to or greater than 1 μm and smaller than 10 μm, and the second distance ranges from 10 μm to 50 μm.

15. A semiconductor light-emitting device, comprising:
a light-emitting structure including a first semiconductor layer, an active layer, and a second semiconductor layer which are sequentially stacked;
a first insulating layer on the second semiconductor layer, the first insulating layer including:
a plurality of first openings having first widths, and
a plurality of second openings having second widths different from the first width;
a first electrode electrically connected to the first semiconductor layer through the plurality of first openings;
a first sub-electrode layer between the second semiconductor layer and the first insulating layer, the first sub-electrode layer being exposed through the plurality of second openings; and
a second sub-electrode layer covering an entirety of the first sub-electrode layer on the first insulating layer, the second sub-electrode layer being connected to the first sub-electrode layer through the plurality of second openings,
wherein a first distance between first openings of the plurality of first openings directly adjacent to each other is different from a second distance between second openings of the plurality of second openings directly adjacent to each other, and wherein the first width is greater than the second width, the first distance is greater than the second distance, and the first openings directly adjacent to each other have no second openings therebetween.

16. The semiconductor light-emitting device as claimed in claim 15, wherein a total area of the plurality of first openings is smaller than a total area of the plurality of second openings.

17. The semiconductor light-emitting device as claimed in claim 15, wherein the first insulating layer has a lower refractive index than the second semiconductor layer.

18. The semiconductor light-emitting device as claimed in claim 15, wherein the plurality of first openings exposes the first semiconductor layer through the first insulating layer, and the plurality of second opening is at a higher level than the plurality of first openings relative to a bottom of the first semiconductor layer.

\* \* \* \* \*